United States Patent [19]
Hiramoto et al.

[11] Patent Number: 5,594,270
[45] Date of Patent: Jan. 14, 1997

[54] SEMICONDUCTOR MEMORY DEVICE

[75] Inventors: Toshiro Hiramoto, Yokohama; Nobuo Tamba; Motoki Kasai, both of Ohme, all of Japan

[73] Assignee: Hitachi, Ltd., Tokyo, Japan

[21] Appl. No.: 314,775

[22] Filed: Sep. 29, 1994

[30] Foreign Application Priority Data

Sep. 29, 1993 [JP] Japan .................................. 5-243002

[51] Int. Cl.$^6$ ............................ H01L 29/76; G11C 11/00
[52] U.S. Cl. ........................ 257/393; 257/401; 257/503; 257/903; 365/156; 365/170; 365/208
[58] Field of Search ..................................... 257/393, 401, 257/503, 903; 365/156, 190, 208

[56] References Cited

U.S. PATENT DOCUMENTS 5,483,083  1/1996  Meguro et al. ........................ 257/903

*Primary Examiner*—Edward Wojciechowicz
*Attorney, Agent, or Firm*—Antonelli, Terry, Stout & Kraus

[57] ABSTRACT

A semiconductor memory device having a plurality of memory cells each comprising two CMOS inverters cross-coupled to each other and arranged at intersections between a plurality of word lines extending in a column direction and a plurality of complementary data line pairs extending in a row direction; wherein p-channel type load MISFETs of the memory cells arranged in the column direction are formed on the main surface of an n-type well region in the direction in which the word lines extend, the source regions of the p-channel type load MISFETs of the memory cells arranged in the column direction are electrically connected to the n-type well region through conductor layers, and each of the conductor layer is formed independently of the memory cells arranged in the column direction. More specifically, the n-type well regions are fed with a first fixed potential, and the source region of each of the p-channel type load MISFETs is fed with the first fixed potential through the conductor layers which are formed independently.

11 Claims, 21 Drawing Sheets

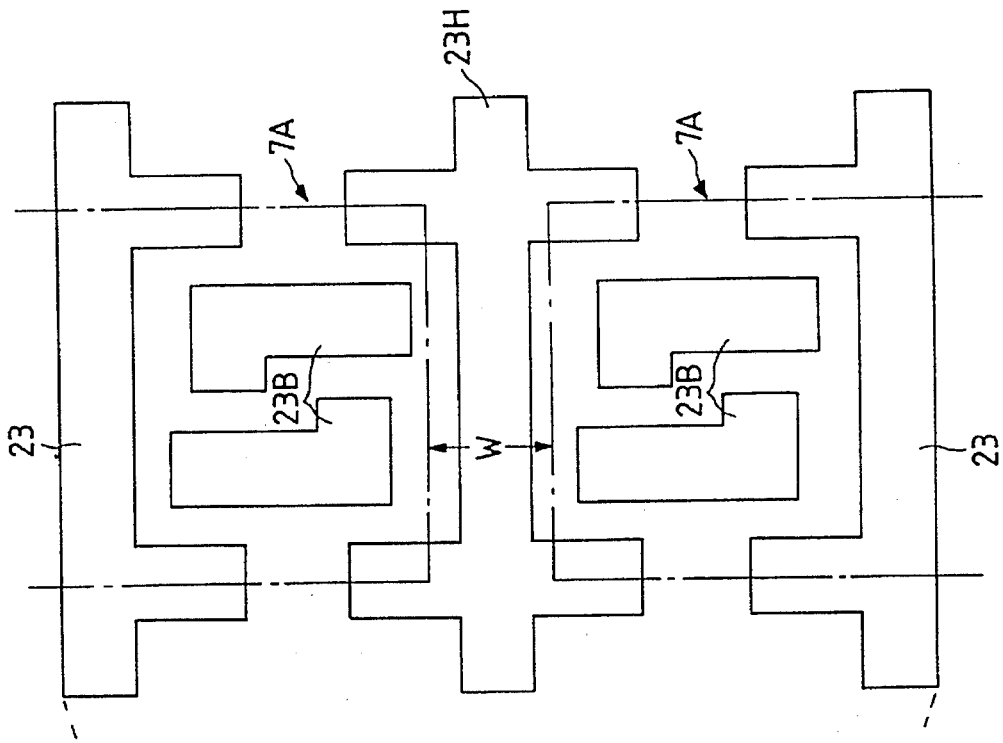

SEMICONDUCTOR MEMORY DEVICE

BACKGROUND OF THE INVENTION

The present invention relates to a semiconductor integrated circuit device and, more particularly, to a technology which is effective if applied to a semiconductor integrated circuit device composed of memory cells having a full CMIS (Complementary Metal Insulator Semiconductor) structure.

The memory cells of an SRAM (i.e., Static Random Access Memory) each storing information of 1 [bit] are arranged at intersections between word lines and complementary data lines (complementary data line pairs). A plurality of these SRAM memory cells are arranged in a matrix in the extending directions of the word lines and the complementary data lines to constitute a memory cell array.

Each memory cell of an SRAM is composed of a flip-flop circuit (or an operational amplifier) and two transfer MOSFETs (Metal Oxide Semiconductor Field Effect Transistors). The flip-flop circuit is constituted as an information storage unit comprising two drive MOSFETs and two load elements. The two transfer MOSFETs and the two drive MOSFETs are of n-channel conduction type.

The memory cell of the SRAM is exemplified by the full CMOS structure in which the load elements are made up of p-channel conduction type load MOSFETs. The memory cell of this full CMOS structure has its p-channel type load MOSFET, n-channel type drive MOSFET and n-channel type transfer MOSFET all formed in a semiconductor substrate. The memory cell of this full CMOS structure is featured by: (1) a low power consumption; (2) a high speed operation; (3) necessity for neither high resistance polysilicon nor polysilicon PMOS to be laminated over the MOSFETs, but for only the CMOS thereby to simplify the manufacturing process; (4) a stable operation even at a low voltage by the drive of the load MOSFETs; and (5) a high resistance to alpha rays. Thus, the memory cell of the full CMOS structure can be widely used in a super-high speed memory such as a large-sized computer, thanks to the aforementioned feature (2), and in a storage unit of a CMOS logic LSI or microprocessor LSI, thanks to the aforementioned feature (3).

In the memory cell having the full CMOS structure, the source region of the n-channel type drive MOSFET is connected to an operation power line fixed at the operation potential (e.g., −2.5 [V]), and the source region of the p-channel type load MISFET is connected to a reference power line fixed at a reference potential (e.g., 0 [V]). Moreover, the drain regions of the n-channel type drive MOSFET and the p-channel type load MOSFET are connected to each other through intra-cell wirings. The power supply line, the reference potential line and the internal wirings are formed of the first level metal wiring layer. Still moreover, either the source region or the drain region of the n-channel type transfer MOSFET is connected through the intra-cell wirings with complementary data lines formed of the second level metal wiring layer.

Incidentally, the memory cell of the SRAM having the aforementioned complete CMOS structure is disclosed in Japanese Patent Application No. 294576/1992, for example.

SUMMARY OF THE INVENTION

We have found out the following problems of the aforementioned SRAM.

In this SRAM, all the power supply line, the reference potential line and the intra-cell wirings are formed of the first level metal wiring layer. Since the size of the memory cell is determined by the first level metal wiring layer, it is difficult to reduce the memory cell size even if the semiconductor elements such as the drive MOSFETs, the transfer MOSFETs and the load MOSFETs are miniaturized.

In the memory cell region, more specifically, the power supply lines and the reference potential lines individually extend in the same direction as that of the word lines, and the intra-cell wirings for connecting the drain regions of the p-channel type load MOSFET and the n-channel type drive MOSFET with each other extend between the power supply line and the reference potential line in the direction perpendicular to the word lines (i.e., in the direction in which the complementary data lines extend).

Between the power supply lines of the memory cells adjacent to each other in the extending direction of the complementary data lines, moreover, there arranged the intra-cell wirings for connecting the n-channel type transfer MOSFET and the complementary data lines.

These power supply line, reference potential line and intra-cell wirings are formed at distances no less than the minimum process size of the wirings. Thus, there arises the aforementioned problem that the size of the memory cell is enlarged.

An object of the present invention is to provide a technology capable of reducing the size of memory cells in a semiconductor integrated circuit device and having the full CMIS structure. Another object of the present invention is to provide a technology capable of achieving the aforementioned object and to enhance the degree of integration of the semiconductor integrated circuit device having the memory cells of the full CMIS structure.

The foregoing and other objects and novel features of the present invention will become apparent from the following description to be made with reference to the accompanying drawings.

A representative of the invention to be disclosed herein will be briefly described in the following.

According to the present invention, there is provided a semiconductor memory device comprising) word lines extending in a column direction, complementary data lines extending in a row direction, and memory cells having first and second inverters which are arranged at the intersections between the word lines and complementary data lines, in each of which the drain regions of a p-channel type load MISFETs and a n-channel type drive MISFET are electrically connected to each other, the gate electrodes thereof are electrically connected to each other, the source region of the p-channel type load MISFET is coupled to a first fixed potential line, and the source region of the n-channel type MISFET is coupled to a second fixed potential line, and the inputs and outputs of which are cross-coupled to each other; wherein the p-channel type load MISEFETs of a plurality of memory cells arranged in the column direction are formed in n-channel well regions in the direction in which the word lines extend, and the source regions of the p-channel type load MISFETs of the memory cells and the n-type well regions are electrically connected to each other through conductor layers, which are formed independently of the plurality of memory cells arranged in the column direction.

By the above-specified means, the well regions can be used as the power supply line to feed the reference potential (or earth potential) or the operation potential (or power supply potential) to the source region of the load MISFET of each memory cell. As a result, it is possible to eliminate the power supply line formed of the first level metal wiring layer on the memory cell and to reduce the cell size of the memory cell.

Since the cell size of the memory cell can be thus reduced, it is possible to enhance the degree of integration of the semiconductor integrated circuit device which is composed of the memory cells having the full CMIS structure.

BRIEF DESCRIPTION OF THE DRAWINGS

FIGS. 25(A) and 25(B) are a top plan view showing only a first level metal wiring layer of the memory cells of the present invention.

BRIEF DESCRIPTION OF THE PREFERRED EMBODIMENTS

The present invention will be described in connection with its construction together with one embodiment in which the present invention is applied to a semiconductor integrated circuit device having a logic circuit and a storage circuit.

Incidentally, throughout all Figures for explaining the embodiments, the components having identical functions are designated by common reference symbols so that their repeated description may be omitted.

Figure 1:
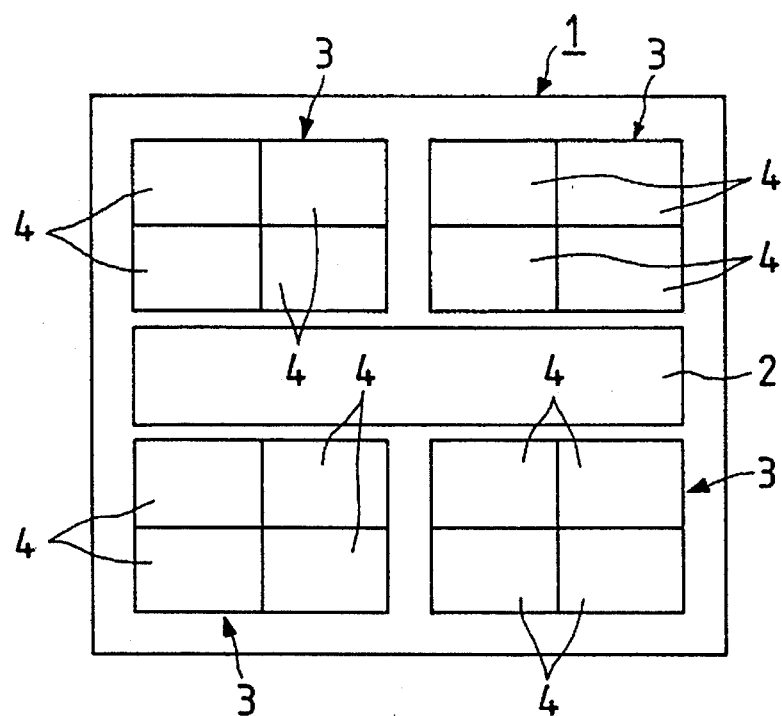
FIG. 1 is a chip layout diagram showing the layout of the circuit system of a semiconductor integrated circuit device having a logic circuit and a storage circuit, of one embodiment according to the present invention.

The layout of a semiconductor integrated circuit device having a logic circuit and a storage circuit in accordance with the present invention is shown in a chip layout diagram in FIG. 1.

As shown in FIG. 1, the semiconductor integrated circuit device is equipped over the main surface of a semiconductor chip 1 with a logic circuit unit 2 and a storage circuit unit 3, and the logic circuit unit 2 is arranged in the central region of the semiconductor chip 1. The storage circuit unit 3 is divided into four blocks, two of which are arranged on each side of the logic circuit unit 2. Each block of the storage circuit unit 3 is composed of four RAM macros. In short, the storage circuit unit 3 is composed of sixteen RAM macros 4.

Figure 2:
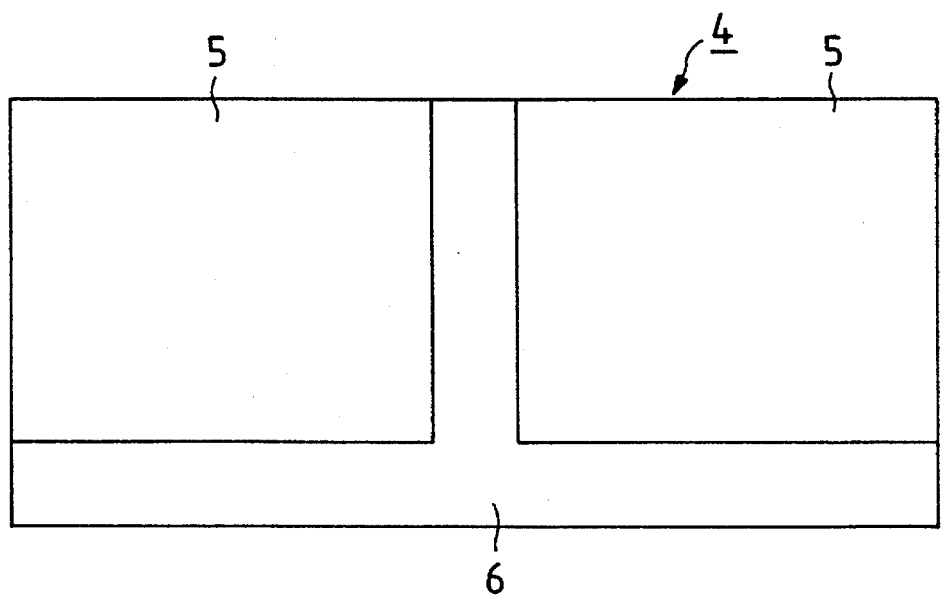
FIG. 2 is a layout diagram showing a RAM macro of FIG. 1.

In this RAM macro 4, as shown in a layout diagram in FIG. 2, two memory mats 5 and a peripheral circuit unit 6 are arranged. In this peripheral circuit unit 6, arranged are peripheral circuits such as a word driver circuit, a decoder circuit, a write driver circuit or a sense amplifier circuit. These peripheral circuits directly control the information writing operation and the information reading operation of the memory cells (7A) arranged in the memory mats 5. The peripheral circuits are composed, although not shown, of semiconductor elements such as p-channel type MISFETs, n-channel type MISFETs and bipolar transistors. In short, the semiconductor integrated circuit device of this embodiment has a so-called Bi-CMOS structure composed of complementary MISFETs and bipolar transistors in a mixed manner.

Figure 3:
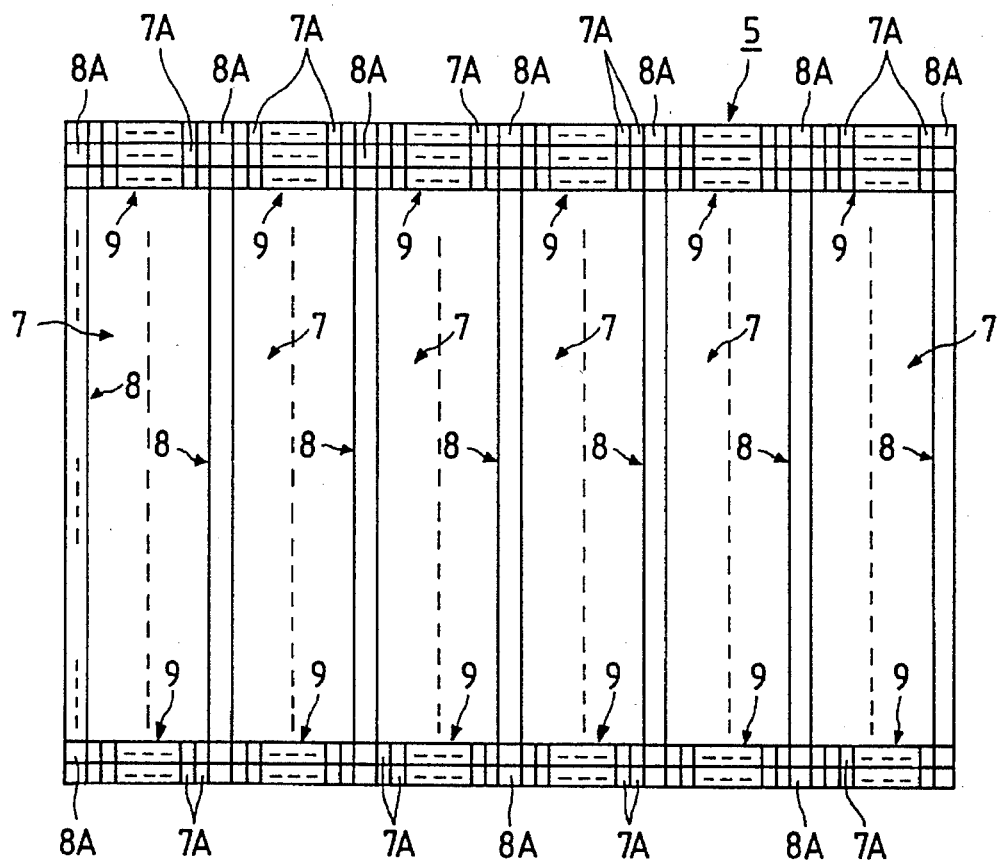
FIG. 3 is a layout diagram showing the memory mat of FIG. 2.

The memory mat 5 has a structure, as shown in a layout diagram in FIG. 3, in which memory cell arrays 7 and power supply cell units 8 are alternately arranged in a column direction. Each memory cell array 7 is an array such that one hundred and twenty eight memory cell columns 9 in each of which in the row direction, say, sixteen memory cells 7A are arranged in the column direction. The power supply cell units 8 are arranged on both sides of each memory cell array 7 and, say, one hundred and twenty eight power supply cells 8A are arranged, in the row direction. In short, the power supply cells 8A are arranged on both sides of each memory cell row 9 of the memory cell array 7. Incidentally, in FIG. 3, the column direction is the direction in which the word lines extend, and the row direction is the direction in which the data lines extend.

Figure 4:
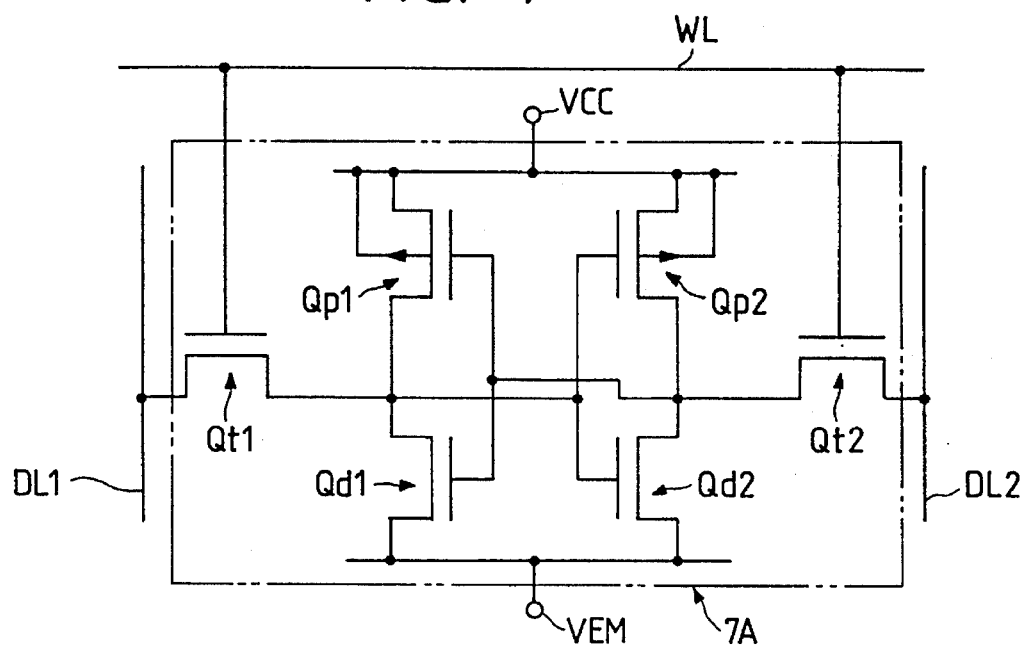
FIG. 4 is a diagram showing an equivalent circuit of the memory cell of FIG. 3.

The memory cell 7A is arranged, as shown in an equivalent circuit diagram in FIG. 4, at the intersection between a word line WL and first and second data lines DL1 and DL2. The memory cell 7A is composed of: a flip-flop circuit having two inverter circuits; and two transfer MISFETs Qt1 and Qt2. In short, the memory cell 7A is constructed of an SRAM (Static Random Access Memory).

One of the source and drain regions of each of the two transfer MISFETs Qt1 and Qt2 is connected with each of a pair of input/output terminals of the flip-flop circuit. The other of the source and drain regions of the transfer MISFET Qt1 is connected with the first data line DL1, and the gate electrode is connected with the word line WL. The other of the source and drain regions of the transfer MISFET Qt2 is connected with the second data line DL2, and the gate electrode connected with the word line WL. These two MISFETs Qt1 and Qt2 are individually of n-channel type.

The aforementioned flip-flop circuit is composed of two drive MISFETs Qd1 and Qd2 and two load MISFETs Qp1 and Qp2. The two drive MISFETs Qd1 and Qd2 are individually of n-channel type. The two load MISFETs Qp1 and Qp2 are individually of p-channel type. In short, the memory cell 7A of the SRAM of the this embodiment is constructed of the full CMIS structure.

The drain regions of the drive MISFET Qd1 and the load MISFET Qp1 are electrically connected with each other, and the gate electrodes are electrically connected with each other, thus constituting a CMIS inverter circuit. Likewise, the drain regions of the drive MISFET Qd2 and the load MISFET Qp2 are electrically connected with each other and the gate electrodes are electrically connected with each other, thus constituting a CMIS inverter circuit. The individual drain regions (or storage nodes) of the drive MISFET Qd1 and the load MISFET Qp1 are electrically connected with one of the source and drain regions of the transfer MISFET Qt1 and are electrically connected with the individual gate electrodes of the drive MISFET Qd2 and the load MISFET Qp2. The individual drain regions (or storage nodes) of the drive MISFET Qd2 and the load MISFET Qp2 are electrically connected with one of the source and drain regions of the transfer MISFET Qt2 and are electrically connected with the individual gate electrodes of the drive MISFET Qd1 and the load MISFET Qp1.

The source regions of the two drive MISFETs Qd1 and Qd2 are fixed at a power potential VEM (e.g., -2.5 [V]). On the other hand, the source regions of the two load MISFETs Qp1 and Qp2 are fixed at a reference potential VCC (e.g., 0 [V]).

Here will be described a specific structure of the memory cell array 7 with reference to FIGS. 5 to 11.

Figure 5:
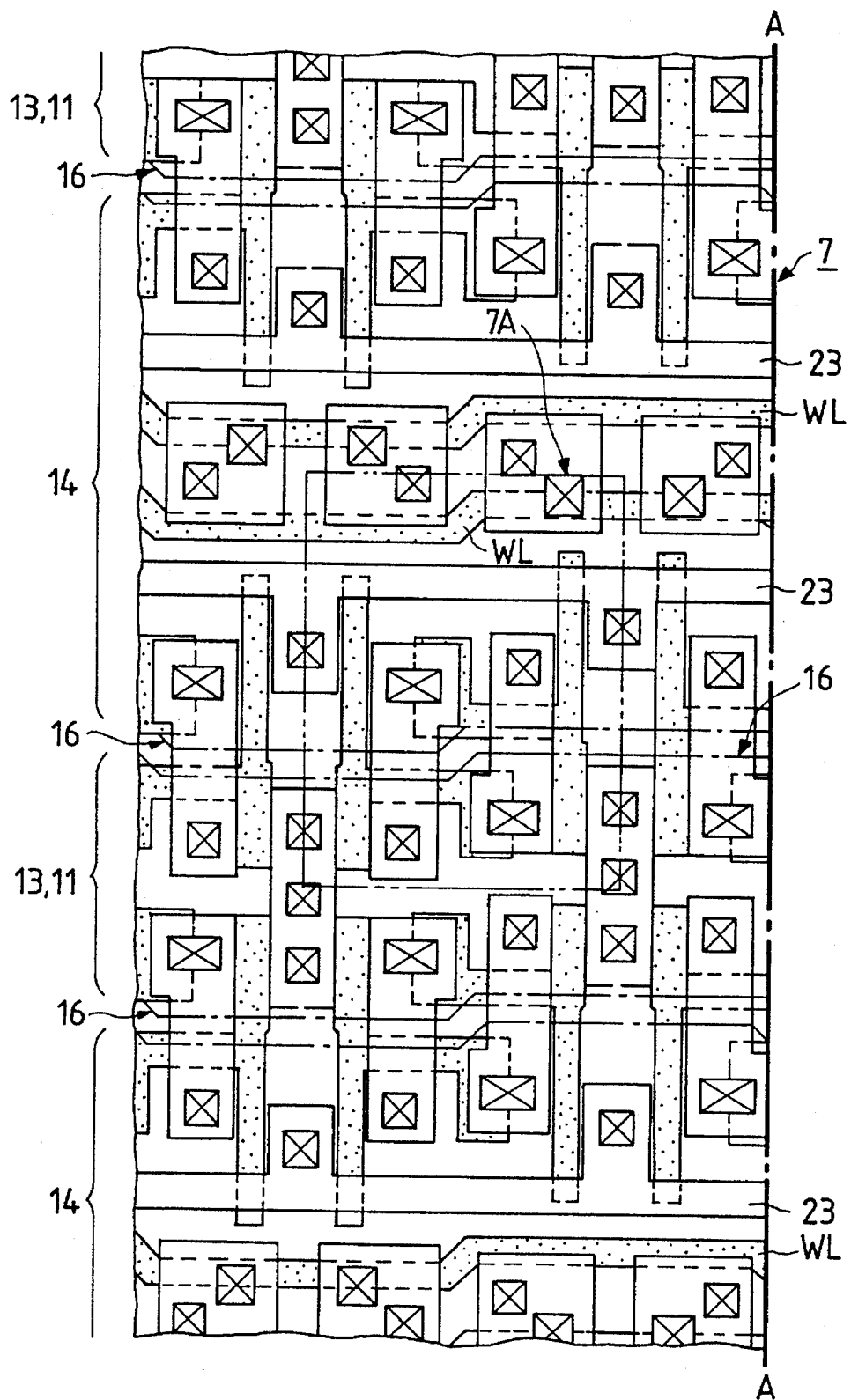
FIG. 5 is a first top plan view showing a divided essential plane of the memory cell array of FIG. 3.
Figure 6:
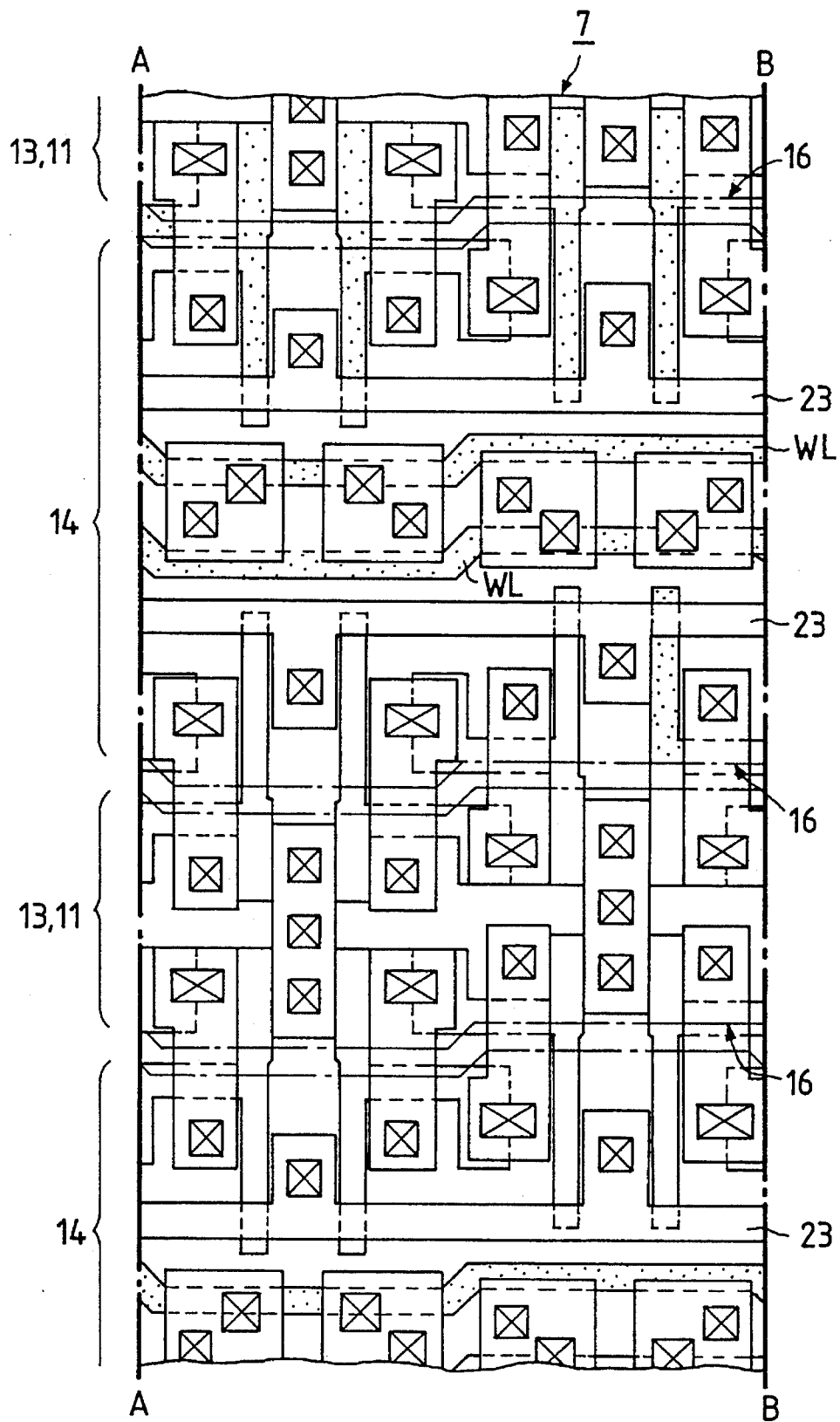
FIG. 6 is a second top plan view showing a divided essential plane of the memory cell array of FIG. 3.
Figure 7:
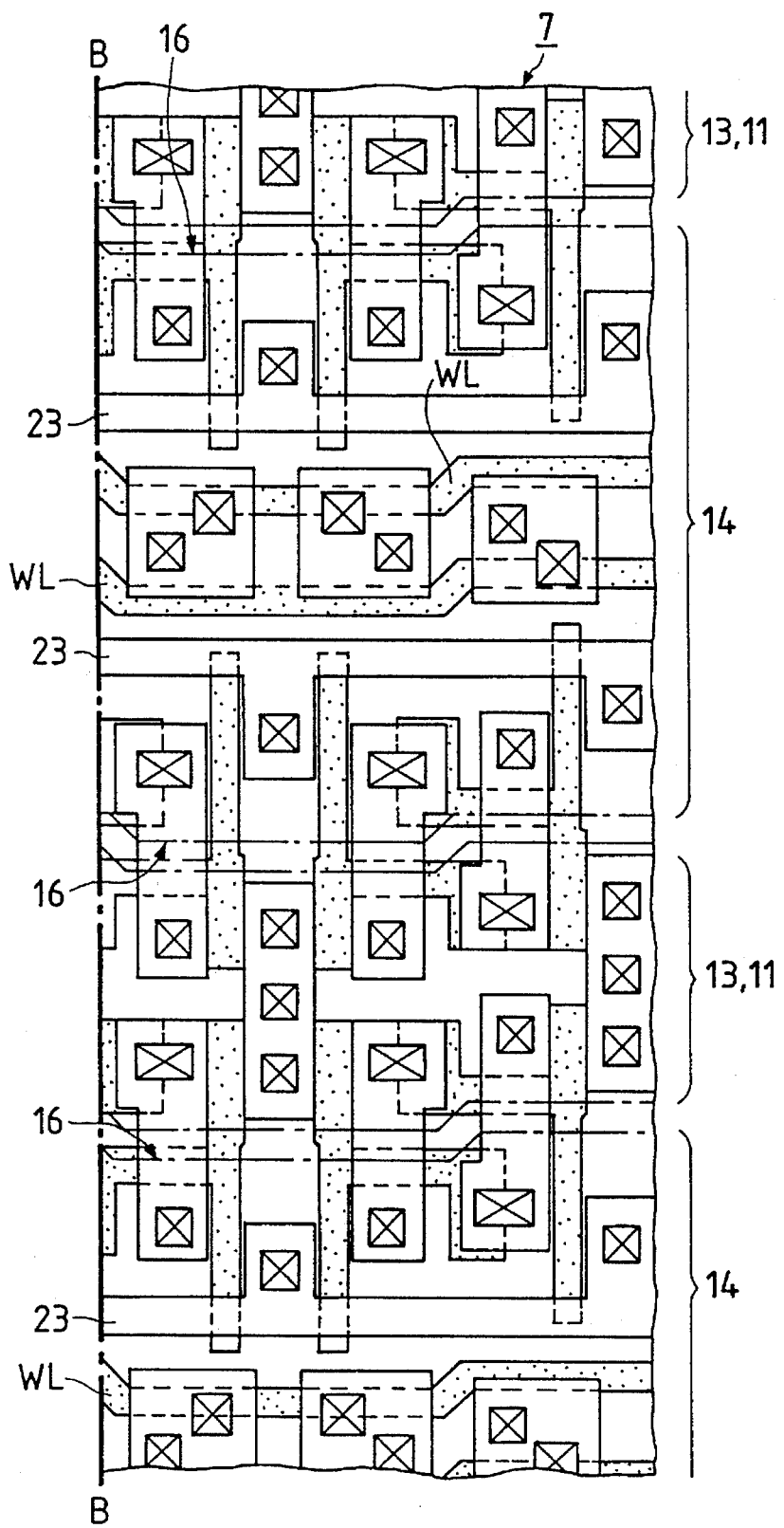
FIG. 7 is a third top plan view showing a divided essential plane of the memory cell array of FIG. 3.

FIGS. 5, 6 and 7 are top plan views showing the essential planes of the memory cell array 7, as taken along lines A—A and B—B.

Figure 8:
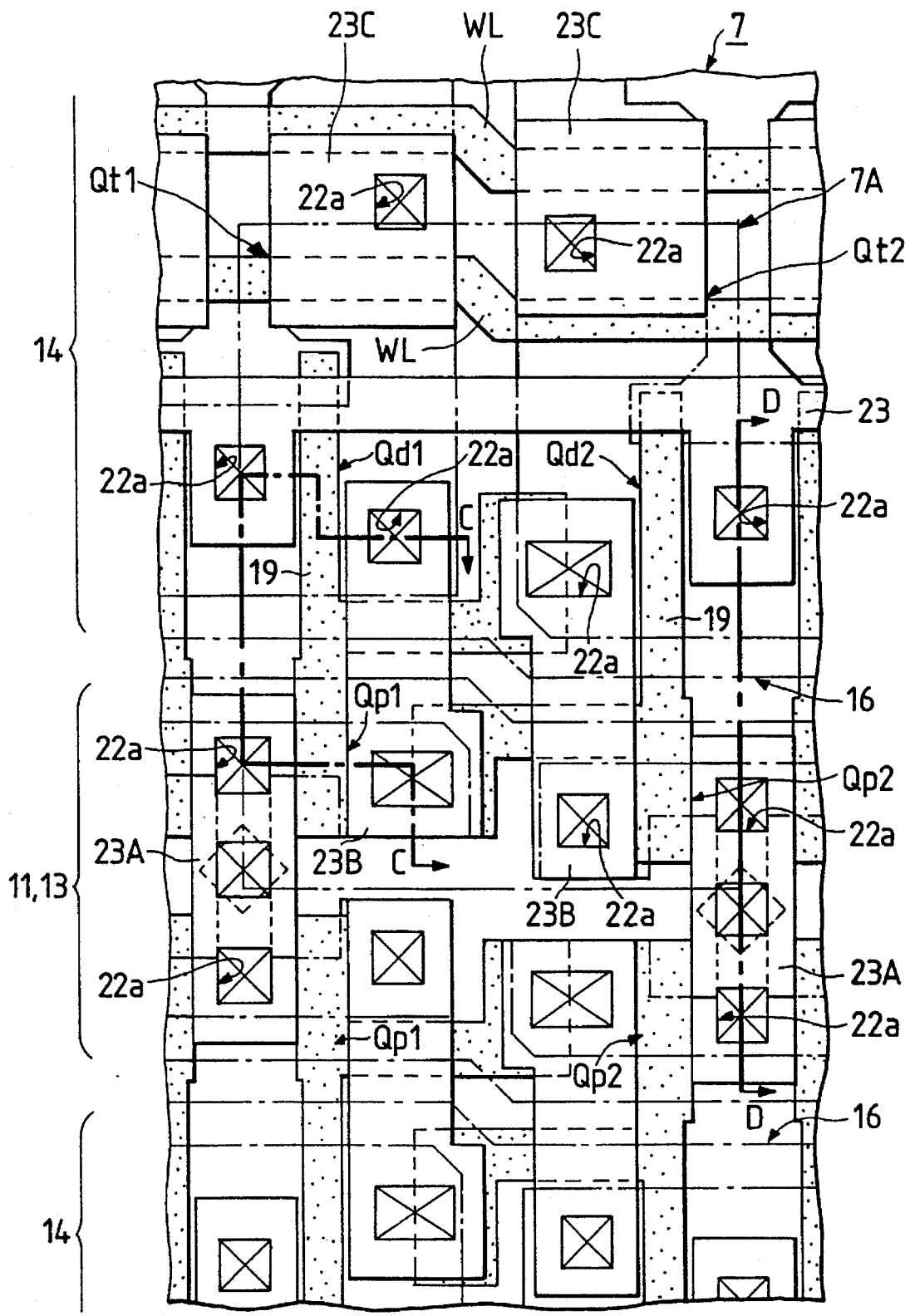
FIG. 8 is an enlarged section showing an essential portion of FIG. 5.

FIG. 8 is an enlarged top plan view showing an essential portion of FIG. 5, and showing the pattern of a field insulating film in addition to those of FIGS. 5 to 7.

Figure 9:
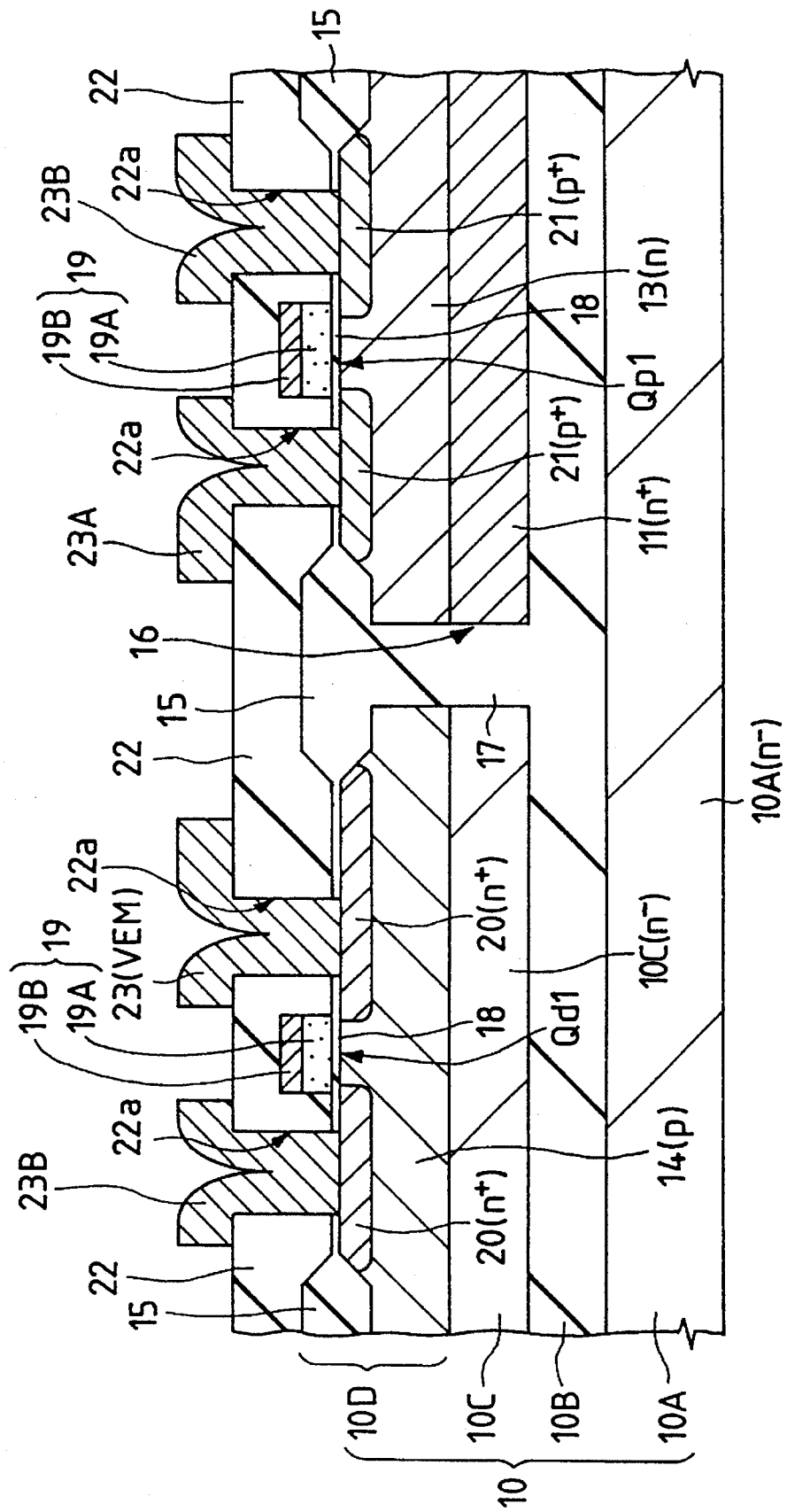
FIG. 9 is a section taken along line C—C of FIG. 8.

FIG. 9 is a section taken along line C—C of FIG. 8.

Figure 10:
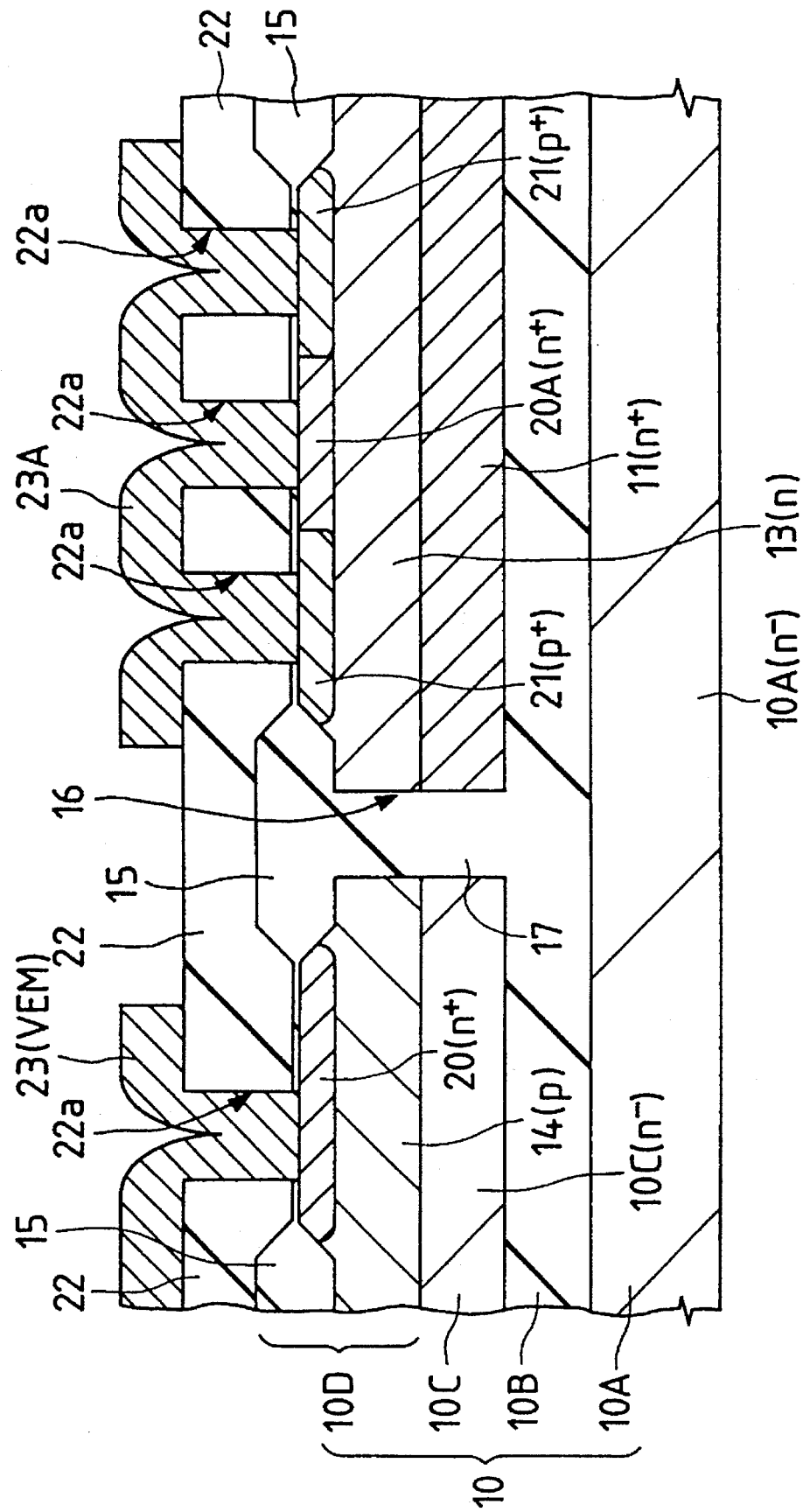
FIG. 10 is a section taken along line D—D of FIG. 8.

FIG. 10 is a section taken along line D—D of FIG. 8.

Figure 11:
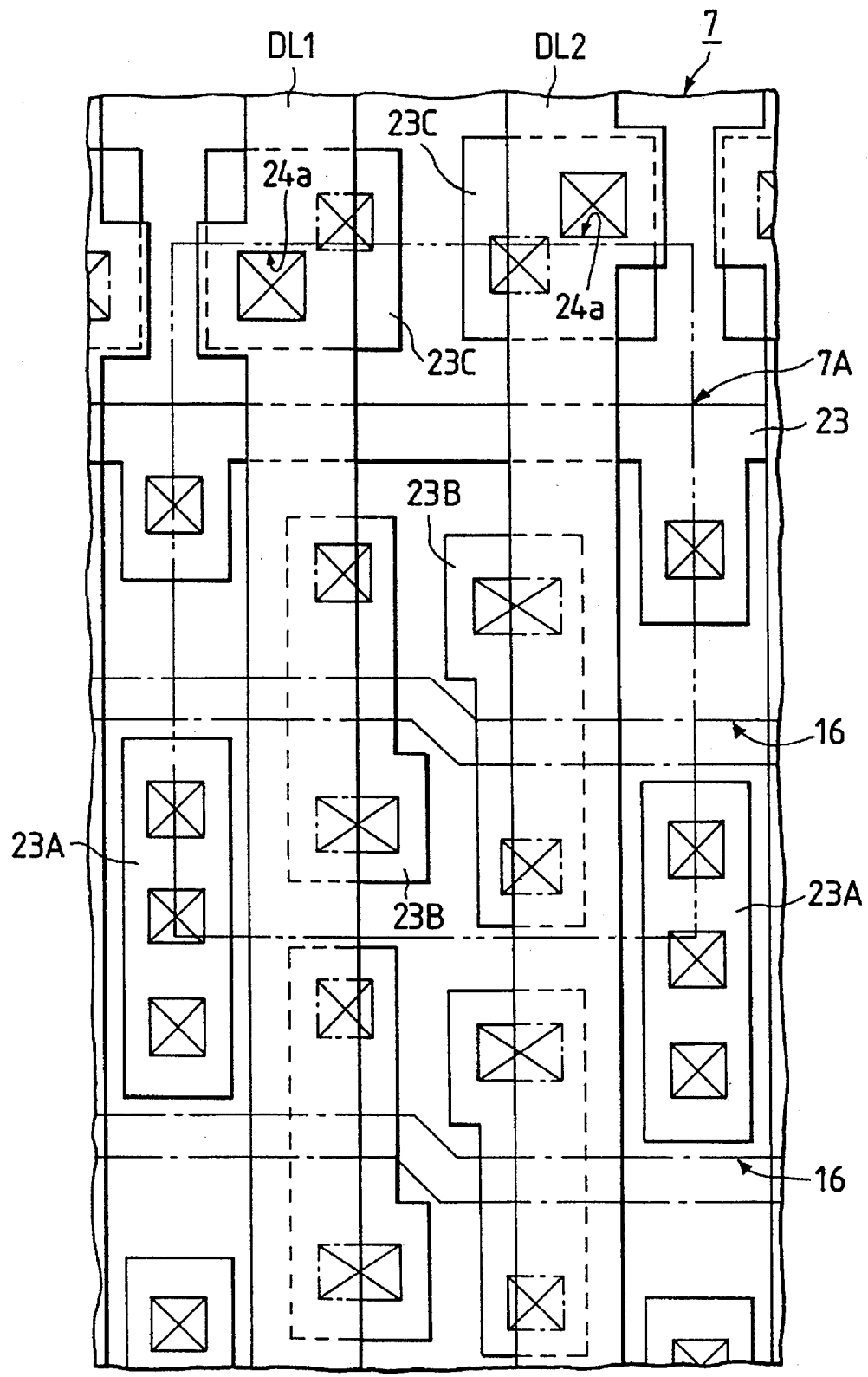
FIG. 11 is an enlarged top plan view showing an essential portion in the same position as that of FIG. 8, and showing only the metal lines.

FIG. 11 is an enlarged top plan view showing an essential portion in the same position of FIG. 8.

Incidentally, FIGS. 5 to 10 are the top plan views including a first level metal wiring layer, and FIG. 11 are the top plan view including a second level metal wiring layer.

As shown in FIGS. 5, 6 and 7, in the aforementioned memory cell array 7, arranged are the word lines WL extending in the column direction, and n-type well regions 13 and p-type well regions 14 extending in the extending direction of the word lines WL. These n-type well regions 13 and p-type well regions 14 are alternately arranged in the row direction and are isolated by isolating channels (groove) 16 extending in the same direction as that in which the word lines WL extends.

The memory cells 7A of the memory cell array 7 are formed, as shown in FIG. 8, in the main surface of the n-type well regions 13 and the p-type well regions 14, which are consecutively formed in the column direction. In the main surface of the n-type well regions 13, the individual load MISFETs Qp1 and Qp2 of the two memory cells 7A which are adjacent in the row direction are provided. In the main surface of the p-type well region 14, the individual drive MISFETs Qd1 and Qd2 and transfer MISFETs Qt1 and Qt2 of the two adjacent memory cells 7A which are adjacent in the row direction are formed.

The aforementioned load MISFET Qp1 is formed, as shown in FIG. 9, of an n-type well region (or channel forming region) 13, a gate insulating film 18, a gate electrode 19, and a pair of $p^+$-type semiconductor regions 21 serving as the source region and the drain region. The paired $p^+$-type semiconductor regions 21 of the source region and the drain region of the load MISFET Qp1 are formed in the main surface of the n-type well region 13 in the area surrounded by a field insulating film 15. The aforementioned load MISFET Qp2 is formed like the load MISFET Qp1, although not shown in FIG. 9.

The aforementioned drive MISFET Qd1 is formed, as shown in FIG. 9, of a p-type well region (or channel forming region) 14, a gate insulating film 18, a gate electrode 19, and a pair of $n^+$-type semiconductor regions 20 serving as the source region and the drain region. The paired $n^+$-type semiconductor regions 20 of the source region and the drain region of the load MISFET Qd1 are formed in the main surface of the n-type well region 14 in the area surrounded by a field insulating film 15. The aforementioned load MISFET Qd2 is formed like the load MISFET Qd1, although not shown.

The aforementioned MISFETs Qt1 and Qt2 are individually constructed like the drive MISFET Qd1, although not shown.

The aforementioned n-type well region 13 and p-type well region 14 are individually formed on the main surface of a semiconductor substrate 10, as shown in FIG. 9. This semiconductor substrate 10 has a so-called SOI (Silicon On Insulator) structure, for example, by stacking an $n^-$-type semiconductor substrate 10C made of single crystal silicon on the main surface of an $n^-$-type semiconductor support substrate 10A made of single crystal silicon through an insulating film 10B and by growing a silicon epitaxial layer 10D on the main surface of the $n^-$-type semiconductor substrate 10C.

The aforementioned field insulating film 15 is formed on the element isolating region (or inactive region) of the main surface of the semiconductor substrate 10. This field insulating film 15 is formed by a well-known selective thermal oxidation method, for example. The aforementioned gate insulating film 18 and insulating film 10B are individually formed of silicon oxide films, for example. The aforementioned isolating groove 16 is made in the main surface of the semiconductor substrate 10 to reach the insulating film 10B. In this isolating groove 16, there is buried an insulating film 17 which is formed of a silicon oxide film, for example.

Below the aforementioned n-type well region 13, there is formed an $n^+$-type semiconductor region 11 whose impurity concentration is set to be higher than that of the n-type well region 13. This $n^+$-type semiconductor region 11 is formed to extend in the extending direction of the n-type well region 13, as shown in FIGS. 5 to 8, in contact with the n-type well region 13 so that it is electrically connected with the same. The $n^+$-type semiconductor region 11 is connected in the same step of forming a buried type semiconductor region or the heavily doped collector region of the bipolar transistor constituting the aforementioned peripheral circuit 6.

To the n+-type semiconductor region 20 or the source region of the aforementioned drive MISFET Qd1, as shown in FIGS. 8 and 9, there is electrically connected a power supply line 23 through a connection hole 22a formed in an inter-layer insulating film 22. Likewise, the power supply line 23 is electrically connected through the connection hole 22a to an n+-type semiconductor region (20) or the source region of the aforementioned drive MISFET Qd2. The power supply line 23 extends in the extending direction of the word lines WL. The power supply line 23 is formed of a first level metal wiring layer of an aluminum film or an aluminum alloy film, or a tungsten film. The power supply line 23 is fixed at the power potential VEM (e.g., −2.5 [V]).

To the n+-type semiconductor region 20 or the drain region of the aforementioned drive MISFET Qd1, there is electrically connected, through the connection hole 22a, one of intra-cell wirings 23B. Likewise, to the n+-type semiconductor region (20) or the drain region of the aforementioned drive MISFET Qd2, there is electrically connected, through the connection hole 22a, the other of the intra-cell wirings 23B. These intra-cell wirings 23B are formed of the first level metal wiring layer and extend in the row direction.

To the p+-type semiconductor region 21 or the drain region of the aforementioned load MISFET Qp1, there is electrically connected, through the connection hole 22a formed in the interlayer insulating film 22, one of the intra-cell wirings 23B. Likewise, to the p+-type semiconductor region (21) or the drain region of the aforementioned load MISFET Qp2, there is electrically connected, through the connection hole 22a, the other of the intra-cell wirings 23B. In other words, the p+-type semiconductor region 21 or the drain region of the load MISFET Qp1 is electrically connected through one of the intra-cell wirings 23B to the n+-type semiconductor region 20 or the drain region of the drive MISFET Qd1, and the p+-type semiconductor region (21) or the drain region of the load MISFET Qp2 is electrically connected through the other internal wiring 23B to the n+-type semiconductor region (20) or the drain region of the drive MISFET Qd2.

To the p+-type semiconductor region 21 or the source region of the load MISFET Qp1, as shown in FIGS. 8, 9 and 10, there is electrically connected, through the connection hole 22a formed in the interlayer insulating film 22, one of the intra-cell wirings 23A. Likewise, to the p+-type semiconductor region 21 or the source region of the load MISFET Qp2, there is electrically connected, through the connection hole 22 the other intra-cell wiring 23A. These intra-cell wirings 23A are formed of the first level metal wiring layer and are independent of the plurality of memory cells 7A arranged in the column direction.

The aforementioned other intra-cell wiring 23A is electrically connected through the connection hole 22a to an n+-type semiconductor region 20A formed on the main surface of the n-type well region 13. Likewise, the aforementioned one internal wiring 23A is electrically connected through the connection hole 22a to the n+-type semiconductor region (20A). In other words, the n+-type semiconductor region 21 or the source region of the load MISFET Qp2 is electrically connected to the n+-type semiconductor region 11 through the one intra-cell wiring 23A, the n+-type semiconductor region 20A and the n-type well region 13, and the p+-type semiconductor region 21 or the source region of the load MISFET Qp1 is electrically connected to the n+-type semiconductor region 11 through the other intra-cell wiring 23A, the n+-type semiconductor region 20A and the n-type well region 13. The n+-type semiconductor regions 20A are individually formed with a view to enhancing the ohmic contact characteristics with the internal wirings 23A, in the same manufacturing step of the n+-type semiconductor regions 20 or the source region and the drain region of the drive MISFET Qd2.

The aforementioned other intra-cell wiring 23A is electrically connected through the connection hole 22a to the n+-type semiconductor region 21 or the source region of the load MISFET (Qp2) of another memory cell 7A adjacent in the column direction. Likewise, the one intra-cell wiring 23A is electrically connected through the connection hole 22a to the n+-type semiconductor region 21 or the source region of the load MISFET (Qp1) of the aforementioned another memory cell. In short, the intra-cell wirings 23A are made integral with the two memory cells 7A adjacent to each other in the row direction. Thanks to this construction in which the intra-cell wirings 23A are made integral with the two memory cells 7A adjacent to each other in the column direction, the area to be occupied by the intra-cell wirings 23A can be reduced to reduce the cell size of the memory cells 7A.

The gate electrode 19 of the aforementioned load MISFET Qp1 is made integral with the gate electrode 19 of the drive MISFET Qd1. Likewise, the gate electrode 19 of the aforementioned load MISFET Qp2 is made integral with the gate electrode 19 of the drive MISFET Qd2. These gate electrodes 19 are individually formed in the step of forming the first level polysilicon wiring layer, and a multilayer film of refractory metal films 19B over a polycrystalline silicon film 19A, for example.

The gate electrodes 19 of the aforementioned load MISFET Qp1 and drive MISFET Qd1 are electrically connected to the other intra-cell wiring 23B, and the gate electrodes 19 of the aforementioned load MISFET Qp2 and drive MISFET Qd2 are electrically connected to the one intra-cell wiring 23B. In other words, the gate electrodes 19 of the load MISFET Qp1 and the drive MIS FET Qd1 are electrically connected to the individual drain regions (21 and 20) of the load MISFET Qp2 and the drive MISFET Qd2, the individual gate electrodes 19 of which are electrically connected to the individual drain regions (21 and 20) of the load MISFET Qp1 and the drive MISFET Qd1.

The gates electrodes 19 of the aforementioned transfer MISFETs Qt1 and Qt2 are made integral with the word lines WL. In other words, the gate electrodes 19 of the transfer MISFETs Qt1 and Qt2 are electrically connected to the word lines WL. These word lines WL are formed of the first level poly-silicon wiring layer.

The one n+-type semiconductor region (20) of the aforementioned transfer MISFET Qt1 is made integral with the n+-type semiconductor region 20 or the drain region of the drive MISFET Qd1. Likewise, the one n+-type semiconductor region (20) of the aforementioned transfer MISFET Qt2 is made integral with the n+-type semiconductor region 20 or the drain region of the drive MISFET Qd2. In other words, the one n+-type semiconductor region 20 of the transfer MISFET Qt1 is electrically connected to the individual drain regions (20 and 21) of the drive MISFET Qd1 and the load MISFET Qp1, and the one n+-type semiconductor region (20) of the transfer MISFET Qt2 is electrically connected to the individual drain regions (21 and 20) of the MISFETs Qd2 and Qt2.

To the other n+-type semiconductor region (20) of the aforementioned transfer MISFET Qt1, there is electrically connected, through the connection hole 22a, one intra-cell wiring 23C. Likewise, to the other n+-type semiconductor region (20) of the aforementioned transfer MISFET Qt2, there is electrically connected, through the connection hole 22a, the other intra-cell wiring 23C. These intra-cell wirings 23C are individually formed of the first level metal wiring layer.

The aforementioned one internal wiring 23C is electrically connected, as shown in FIG. 11, through a connection hole 24a formed in an inter-layer insulating film (24) to the first data line DL1 extending in the row direction, and the other internal wiring 23C is electrically connected through the connection hole 24a to the second data line DL2 extending in the row direction. In other words, the one $n^+$-type semiconductor region 20 of the transfer MISFET Qt1 is electrically connected through the one intra-cell wiring 23C to the first data line DL1, and the one $n^+$-type semiconductor region 20 of the transfer MISFET Qt2 is electrically connected through the other intra-cell wiring 23C to the second data line DL2. The first data line DL1 and the second data line DL2 are individually formed of a second level metal wiring layer such as an aluminum film or an aluminum alloy film.

The memory cells 7A thus constructed are arranged in plurality in the extending direction of the word lines WL and in plurality in the extending direction of the first data line DL1 and the second data line DL2.

Here will be described a specific structure of the power supply cell 8A with reference to FIGS. 12 and 13.

Figure 12:
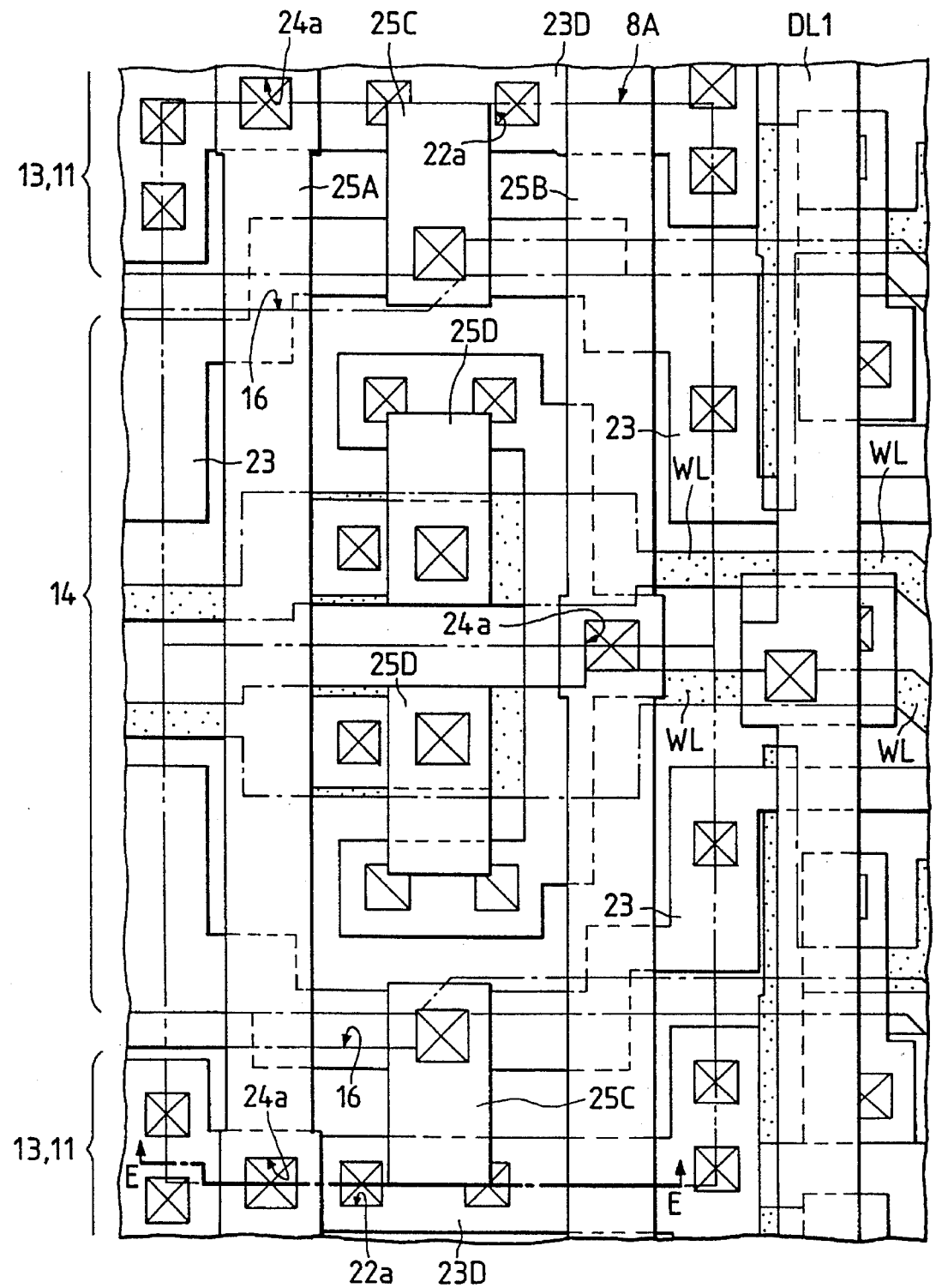
FIG. 12 is a top plan view showing an essential portion of a power supply cell array of FIG. 3.
Figure 13:
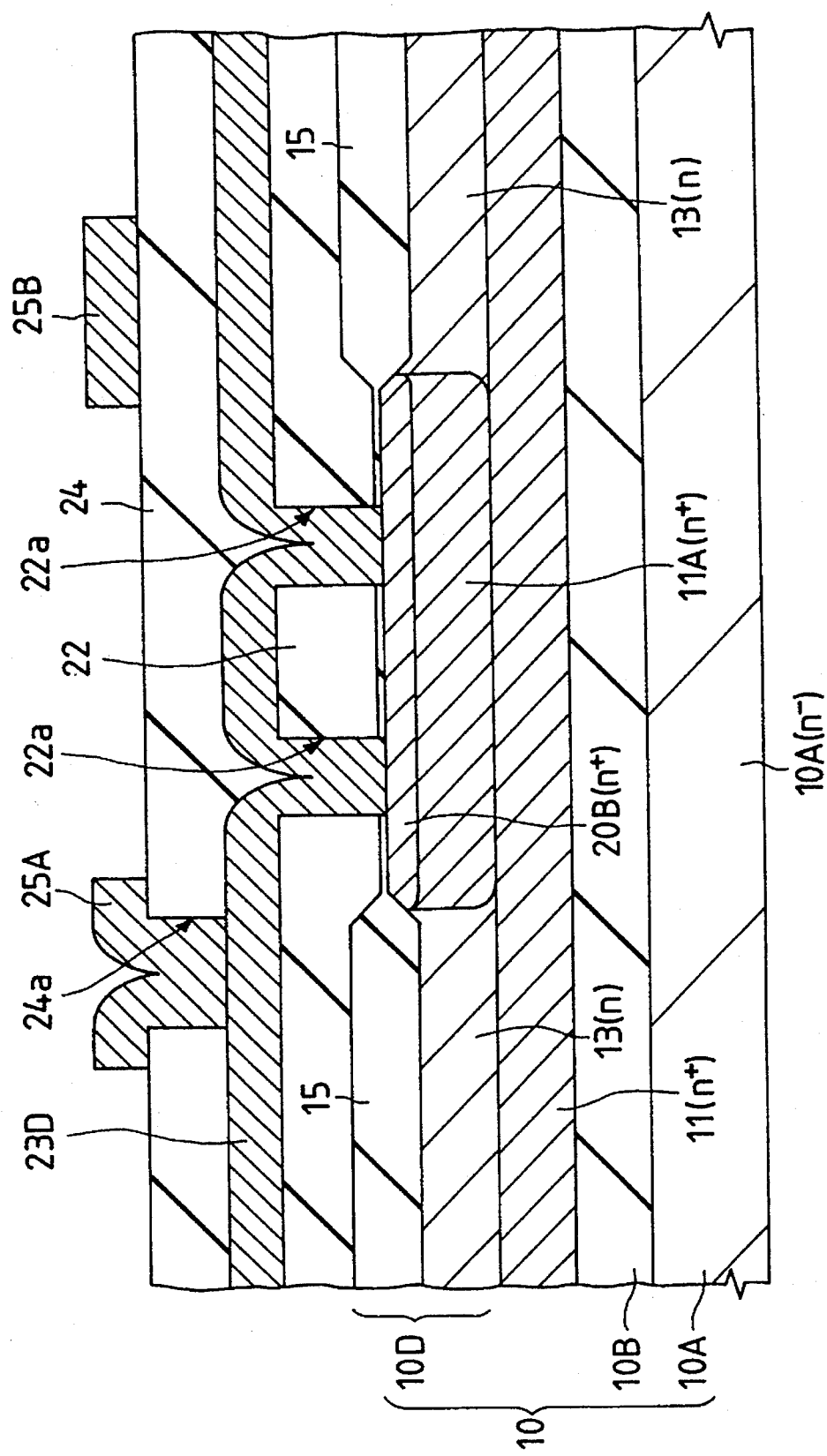
FIG. 13 is a section taken along line E—E of FIG. 12.

FIG. 12 is a top plan view showing an essential portion of the power supply cell 8A, and FIG. 13 is a section taken along line E—E of FIG. 12. Incidentally, FIGS. 12 and 13 shows the structure as deep as the second-level metal wiring layer.

As shown in FIGS. 12 and 13, in the power supply cell 8A, a power supply line 25A and a power supply line 25B both extending in the row direction are provided. The power supply line 25A is fixed at the reference potential VCC (e.g., 0 [V]), whereas the power supply line 25B is fixed at a power potential VEE (e.g., −3.1 [V]). The power supply lines 25A and 25B are individually formed of the second level metal wiring layer such as an aluminum film or an aluminum alloy film.

The aforementioned power supply line 25A is electrically connected through the connection hole 24a formed in the interlayer insulating film 24 to a wiring line 23D. This wiring line 23D is formed of the first-level metal wiring layer. The wiring line 23D is electrically connected through the connection hole 22a formed in the interlayer insulating film 22 to an $n^+$-type semiconductor region 20B. This $n^+$-type semiconductor region 20B is formed in the main surface of the n-type well region 13 in the area surrounded by the field insulating film 15. The $n^+$-type semiconductor region 20B is formed in the same step of forming the aforementioned $n^+$-type semiconductor region 20A.

The aforementioned $n^+$-type semiconductor region 20B is electrically connected to an $n^+$-type semiconductor region 11A. This $n^+$-type semiconductor region 11A is formed in the n-type well region 13 in the area surrounded by the field insulating film 15 and is electrically connected to the $n^+$-type semiconductor region 11. The $n^+$-type semiconductor region 11A is formed in the same step of forming a heavily doped semiconductor region for the contact with the collector of a bipolar transistor used in the aforementioned peripheral circuit.

To the aforementioned $n^+$-type semiconductor region 11 and n-type well region 13, the power supply line 25A is electrically connected through the $n^+$-type semiconductor region 11A, the $n^+$-type semiconductor region 20B and the wiring line 23D. In short, the $n^+$-type semiconductor region 11 and the n-type well region 13 are fixed at the reference potential (e.g., 0 [V]).

The $n^+$-type semiconductor region 11 formed below the aforementioned n-type well region 13 is electrically connected, as described above, to the individual source regions (21) of the load MISFETs Qp1 and Qp2 through the n-type well region 13, the $n^+$-type semiconductor region 20A and the intra-cell wiring 23A. In other words, the $n^+$-type semiconductor region 11 and n-type well region 13 are used as the power supply lines, and the source regions (21) of the load MISFETs Qp1 and Qp2 are fixed at the reference potential (e.g., 0 [V]). Thus, the $n^+$-type semiconductor region 11 and the n-type well region 13 are fixed at the reference potential and are used as the power supply lines, so that the source regions (21) of the load MISFETs Qp1 and Qp2 of each memory cell 7A are applied with the reference potential. As a result, the power supply lines formed of the first level metal wiring layer on the memory cell 7A can be eliminated to reduce the size of the memory cell 7A.

The memory size reduction will be more specifically described with reference to FIG. 25. FIG. 25 is a top plan view showing an essential portion of the memory cell unit, that is, only the pattern of the first level metal wiring of the memory cell 7A. The pattern of FIG. 25(A) is the one to which the present invention is applied, and the pattern of FIG. 25(B) is the one in which power supply lines 23H for feeding the power potential to the p-channel type MISFETs Qp1 and Qp2 extend in the column direction. As is apparent from FIG. 25, the present invention uses not the power supply lines 23H but the n-type wells 23 below the memory cell 7A as the power supply lines, so that the distance between the two memory cells 7A formed adjacent to each other in the row direction can be reduced by a space W in which the power supply lines 23H is formed. As a result, it is possible to highly integrate the semiconductor memory device.

Since, moreover, the aforementioned n-type wells 13 are used as the power supply lines, there arises no process increase caused by the formation of a special region for the power supply.

Incidentally, the power supply lines 25B are electrically connected to the p-type well region 14 through the wiring formed of the first level metal wiring layer. Moreover, wirings 25C are electrically connected to not only the power supply lines 23 but also the power supply lines which are formed of the third level metal wiring layer. These power supply lines are fixed at the operation potential (e.g., −2.5 [V]) and extend in the same direction as the extending direction of the power supply lines 23. Still, moreover, wirings 25D are electrically connected to not only the word lines WL but also the word line backing wiring (i.e., the word shunting wiring) formed of the third level metal wiring layer. These backing wiring extend in the same direction as that of the word lines WL.

Figure 14:
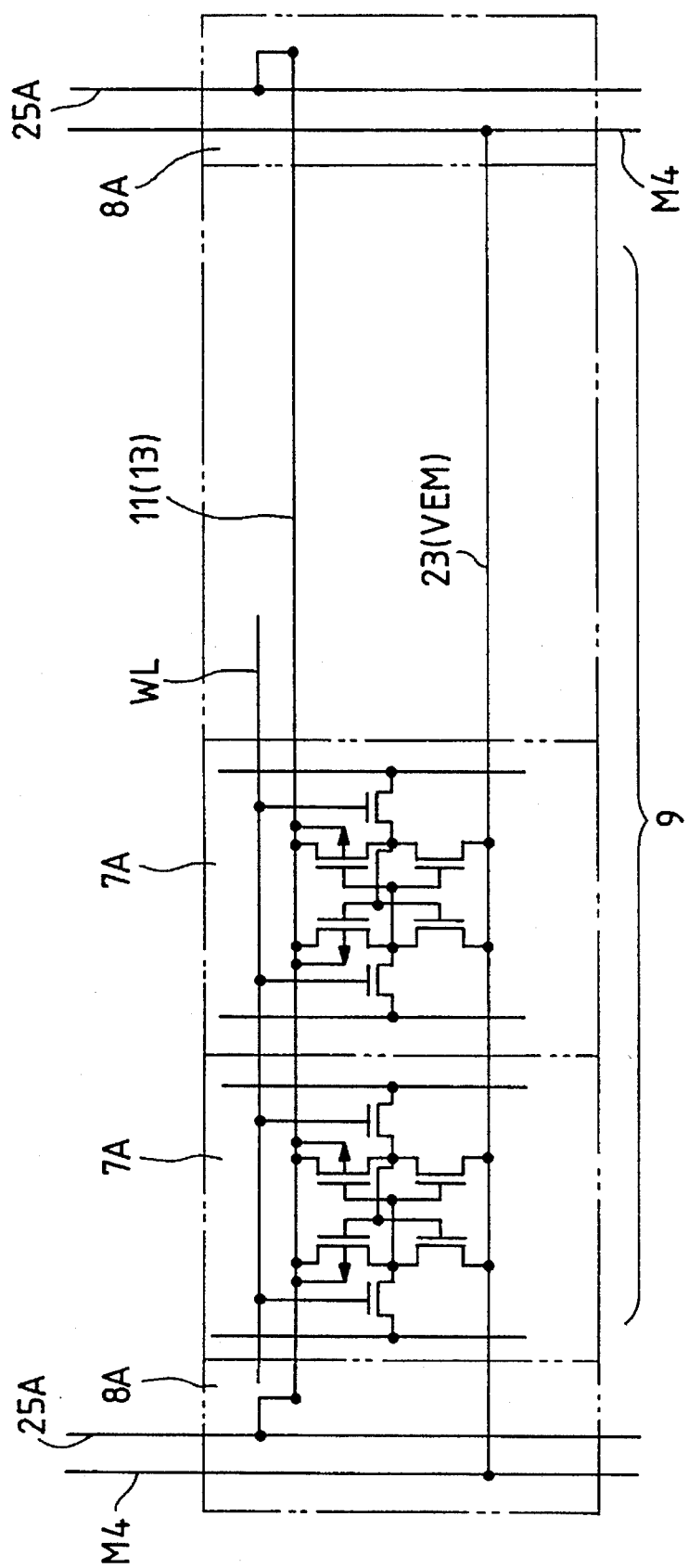
FIG. 14 is a diagram showing an equivalent circuit of a memory cell row of FIG. 3.

The power supply cells 8A thus constructed are arranged on both sides of each memory cell array 9 composed of sixteen memory cells 7A, as shown in FIG. 14 showing the memory cell array circuit, to feed the individual memory cells 7A with the power from both sides of the memory cell array 9.

Figure 15:
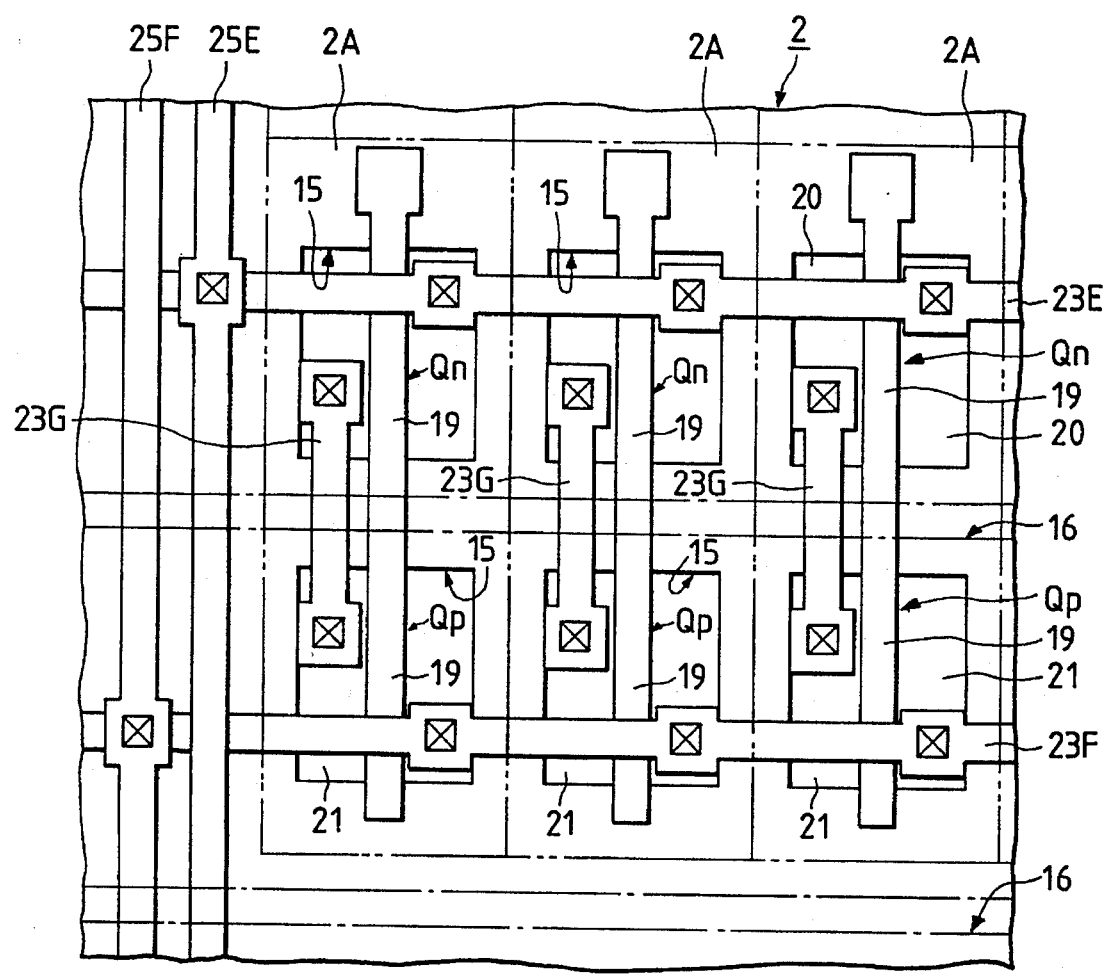
FIG. 15 is a top plan view showing an essential portion of the logic circuit unit of FIG. 2.

Here will be briefly described a specific structure of the aforementioned logic circuit unit 2 with reference to FIG. 15 (a top plan view of an essential portion).

As shown in FIG. 15, in the central part of the logic circuit unit 2 a plurality of standard cells 2A are formed. These standard cells 2A are regularly arranged in the row direction and in the column direction.

Each standard cell 2A is composed of a p-channel MISFET Qp and an n-channel MISFET Qn. Of these, the p-channel MISFET Qp is formed on the main surface of the n-type well region 13 in the area surrounded by the field insulating film 15. In other words, the p-channel MISFET Qp is composed of the n-type well region (channel forming region) 13, the gate insulating film, the gate electrode 19, and the $p^+$-type semiconductor regions 21 of the source and drain regions. Likewise, the n-channel MISFET Qn is formed on the main surface of the p-type well region 14 in the area surrounded by the field insulating film 15. In other words, the n-channel MISFET Qn is composed of the p-type well region (channel forming region) 14, the gate insulating film, the gate electrode 19, and the $n^+$-type semiconductor regions 20 of the source and drain regions.

To the $p^+$-type semiconductor region 21 or the drain region of the aforementioned p-channel MISFET Qp, the $n^+$-type semiconductor region 20 or the drain region of the n-channel MISFET Qn is electrically connected through an internal wiring 23G. To the $p^+$-type semiconductor region 21 or the source region of the p-channel MISFET Qp, a power supply line 23F extending in the column direction is electrically connected. To the $n^+$-type semiconductor region 20 or the source region of the n-channel MISFET Qn, a power supply line 23E extending in the column direction is electrically connected. The internal wiring 23G, the power supply line 23E and the power supply line 23F are individually formed in the first level metal wiring layer.

To the power supply line 23E, a power supply line 25E which is formed in the second level metal wiring layer is electrically connected. To the power supply line 25E, moreover, a power supply line 25F which is formed in the second level metal wiring layer is electrically connected. These power supply lines 25E and 25F individually extend in the column direction. The power supply line 25E is fixed at the operation potential whereas the power supply line 25F is fixed at the reference potential. In other words, the $n^+$-type semiconductor region 20 or the source region of the n-channel MISFET Qn is fixed at the opeation potential whereas the $p^+$-type semiconductor region 21 or the source region of the p-channel MISFET Qp is fixed at the reference potential.

Here will be described the operations of the aforementioned memory cells 7A with reference to the accompanying drawings.

Figure 16:
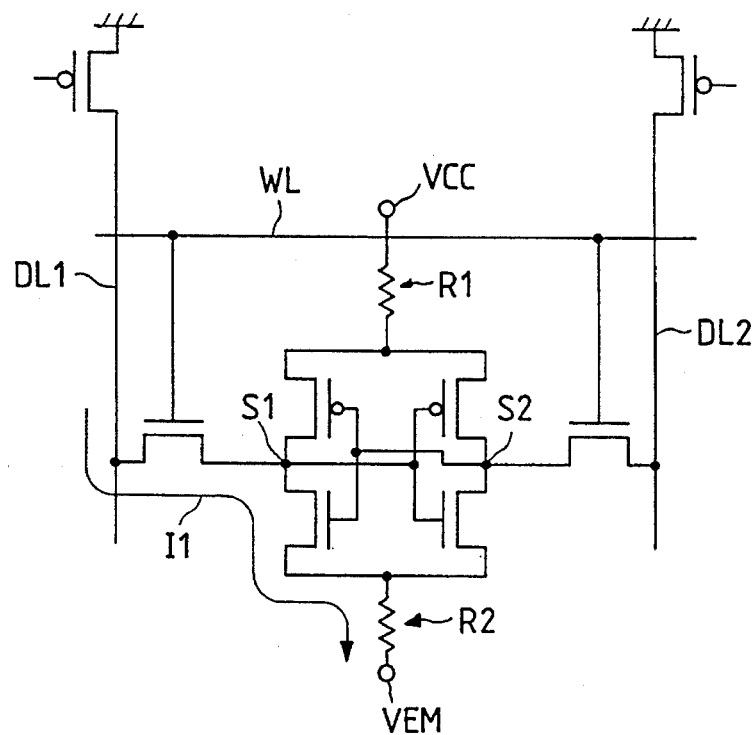
FIG. 16 is a diagram showing an equivalent circuit for explaining the operation of the memory cell.

At the reading time, the word line WL of the corresponding bit is selected so that a cell current I1 flows from the first data line DL1 to the VEM through a storage node S1 of the Low side, as shown in FIG. 16 (equivalent circuit diagram). As a result of the voltage drop by the cell current I1, a potential difference is established between the first data line DL1 and the second data line DL2, and the potential difference is read by a sense amplifier. As a result, a current flows through a VCC wiring resistor R2, but no current flows through a VEM wiring resistor R1.

Figure 17:
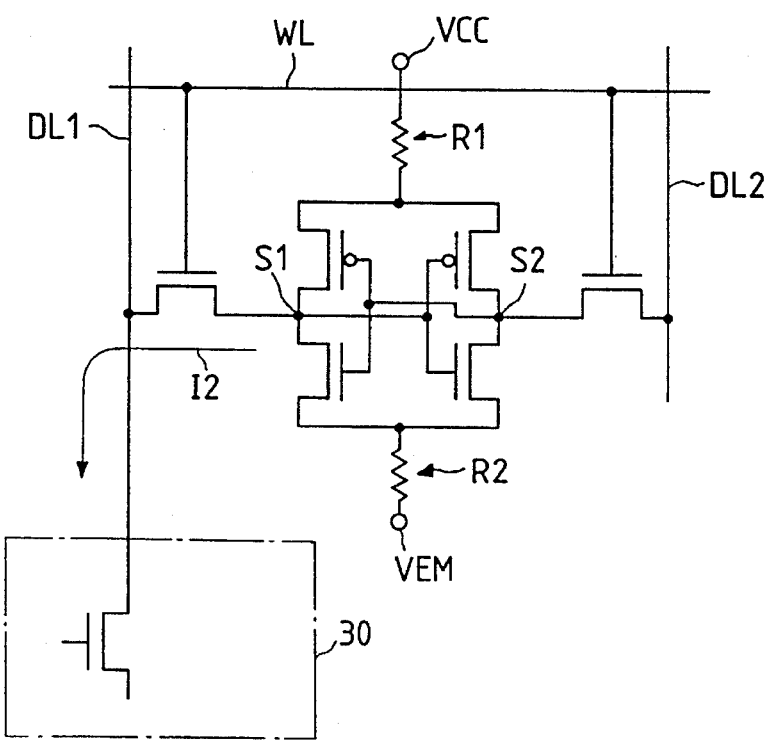
FIG. 17 is a diagram showing an equivalent circuit for explaining the operation of the memory cell.
Figure 18:
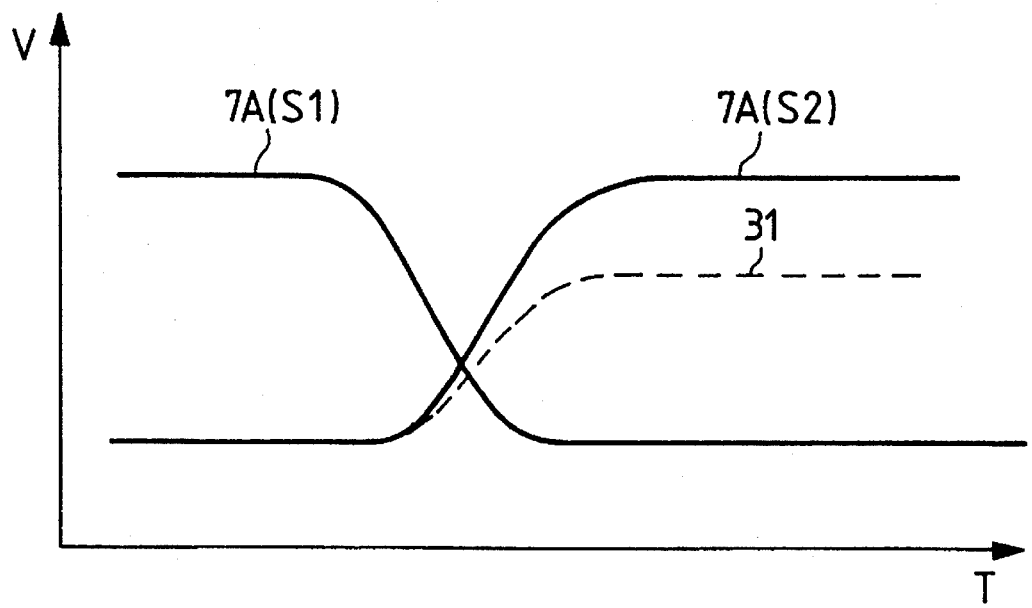
FIG. 18 is a diagram illustrating the relation between the potential of a storage node and the time when in writing operation.

At the writing time, on the other hand, the potential of the first data line DL1 pm the High side is lowered by a write circuit 30, as shown in FIG. 17 (equivalent circuit diagram). As a result, the storage node S1 at the High level is switched to the Low level whereas the storage node S2 at the Low level is switched to the High level by the current fed from the VCC. As a result, a current flows through the VEM wiring resistor R1 whereas no current flows through the VCC wiring resistor R2. The changes in potential of the righthand and lefthand storage nodes S1 and S2 at this time are plotted in FIG. 18 showing the relation between the potential of the storage nodes at the writing time and the time. For reference, the memory cell 7A having the full CMIS structure and a high-resistance load memory cell 31 are compared as an example.

In the memory cell 7A of the full CMIS structure, the storage node (S2) at the Low level is instantly changed to the High level by the driving force of the load MISFET. In the high-resistance load memory cell 31, on the contrary, the current flowing out from the VCC is so extremely low because of a high load resistance (of about 100 megaohms) that it takes a long time (of 1 s or more) to reach the completely High potential. Since the potential difference between the righthand and lefthand storage nodes is small in this meanwhile, the storage charge of the storage nodes is so small that the strength against the alpha rays is low.

In short, the VEM wiring resistor R2 raises a problem at the reading time, and the VCC wiring resistor R1 raises a problem at the writing time.

Then, the VCC wiring resistor will be studied. Since the n-type well region 13 and the $n^+$-type semiconductor region 11 are used for the VCC wiring, the resistance is higher than that of when the first level metal wiring layer is used. In the full CMIS memory cell 7A, the load element is the p-channel type MISFET, the driving force of which is used to achieve the ultrahigh speed, the stability and the resistance to the alpha rays. As a result, the VCC wiring is equipped with a high resistance, the driving force of the PMOS is substantially weakened to deteriorate the merit of the CMIS memory cell.

Figure 19:
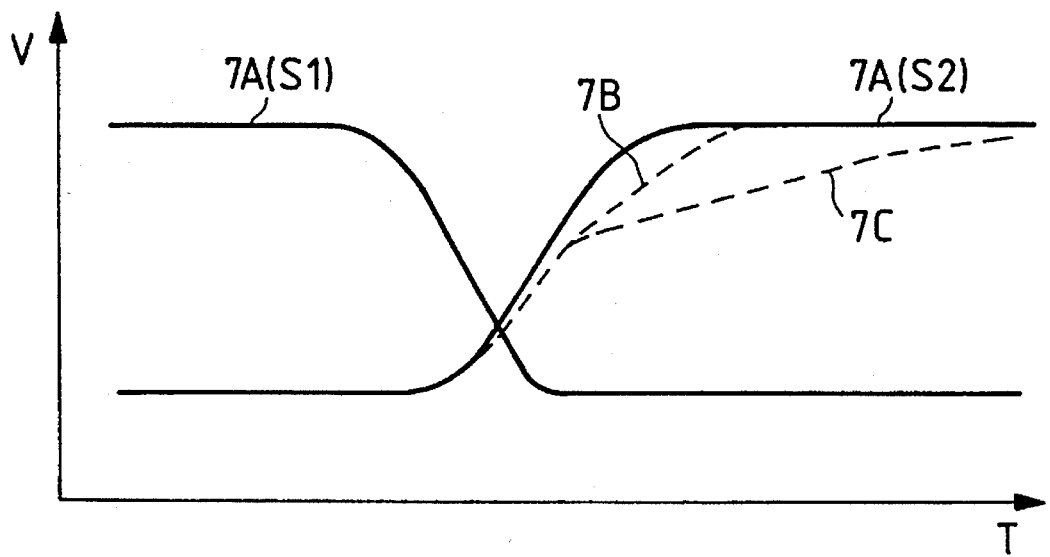
FIG. 19 is a diagram showing a change in the writing characteristics.

However, the ON resistance of the load MISFET is about 10 [KΩ]. Hence, the high-speed operation is not adversely affected if the power supply line resistance is lower than one tenth of that value, i.e., about 1 [KΩ]. Even when the power supply line resistance is several tens [KΩ], the resistance is lower than those of the high-resistance load memory cell (of 100 [MΩ] or more) and the poly-silicon PMOS load (the ON resistance is 1 [MΩ] or more), so that the driving force of the load PMOS can be exploited. Thus, the CMIS memory cell 7A is far more advantageous in terms of high speed operation and stability. For reference, FIG. 19 shows the changes in the writing characteristics due to the power supply line resistance. In FIG. 19: a curve 7A (S2) shows the change when the power supply line resistance is 1 [KΩ] or less; a curve 7B shows the change when the power supply line resistance is 1 to 20 [KΩ]; and a curve 7C shows the change when the power supply line resistance is 20 to 100 [KΩ]. From these points, the upper limit of the VCC wiring resistance R1 is about 100 [KΩ].

In the embodiment, the $n^+$-type semiconductor region 11 and the n-type well region 13 have sheet resistance of about 30 [Ω], the $n^+$-type semiconductor region 11 and the n-type well region 13 have widths of 4 microns, and the distance between the power supply cells 8A is about 80 microns. The resistance of the $n^+$-type semiconductor region 11 and the n-type well region 13 from the memory cell 7A the farthest from the power supply cell 8A to the power supply cell 8A (located just at the midpoint from the cells) is about 300 [Ω]. Since the power supply line resistance is about 150 [Ω], as viewed from the memory cell 7A, there is no influence at all considering that the power supply cells 8A are provided on both sides. Even when, moreover, the $n^+$-type semiconductor region 11 is not used in the CMIS process, the sheet resistance of the n-type well region 13 is about 1 [KΩ], so that the power supply line resistance is about 5 [KΩ], and there is no influence.

Here will be examined the VEM wiring resistor R2 in the following (with reference to FIG. 16). At the reading operation, a voltage drop is established in the resistor by the current I1 to float the source potential of the drive MISFET. If the upper limit of this potential rise is set to about 1 [V] and if the current I1 is set to about 0.1 [mA], the VEM wiring resistor R1 has an upper limit of about 10 [KΩ].

It can be understood from the description made above that the $n^+$-type semiconductor region 11 and the n-type well region 13 are remarkably effectively used as the power supply lines for the memory cells 7A.

Incidentally, in the embodiment, the $n^+$-type semiconductor region 11 and the n-type well region 13 are used as the power supply lines, but the p-type well region 12 may be used as the power supply line to eliminate the power supply line 23 which is formed of the first level metal wiring layer.

Figure 20:
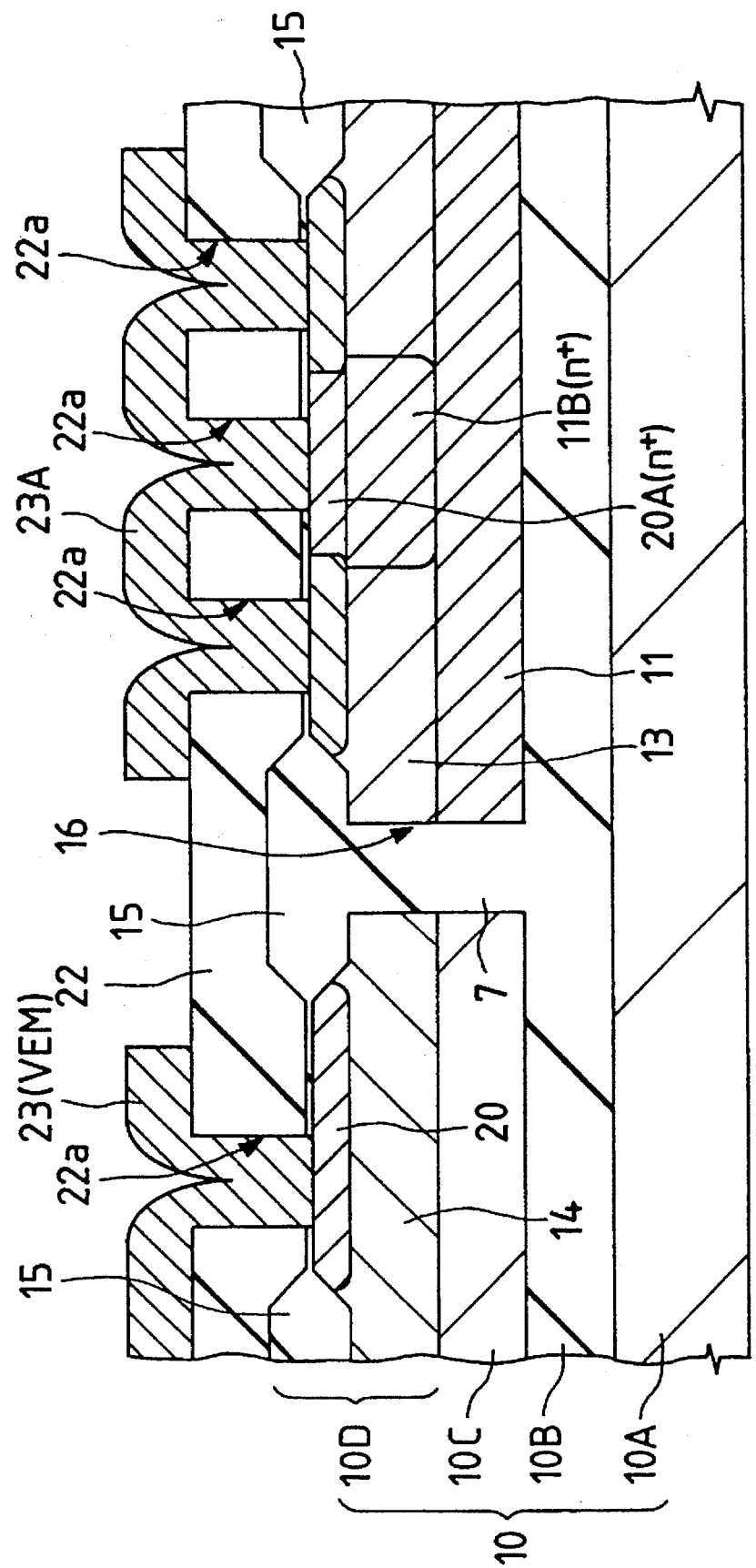
FIG. 20 is a section showing a modification of the present invention.

As shown in FIG. 20 (sectional view), moreover, an $n^+$-type semiconductor region 11B may be formed between the $n^+$-type semiconductor region 20A and the $n^+$-type semiconductor region 11 to electrically connect the $n^+$-type semiconductor region 20A and the $n^+$-type semiconductor region 11. The $n^+$-type semiconductor region 11B is formed in the same step as that of forming the $n^+$-type semiconductor region 11A shown in FIG. 13.

Figure 21:
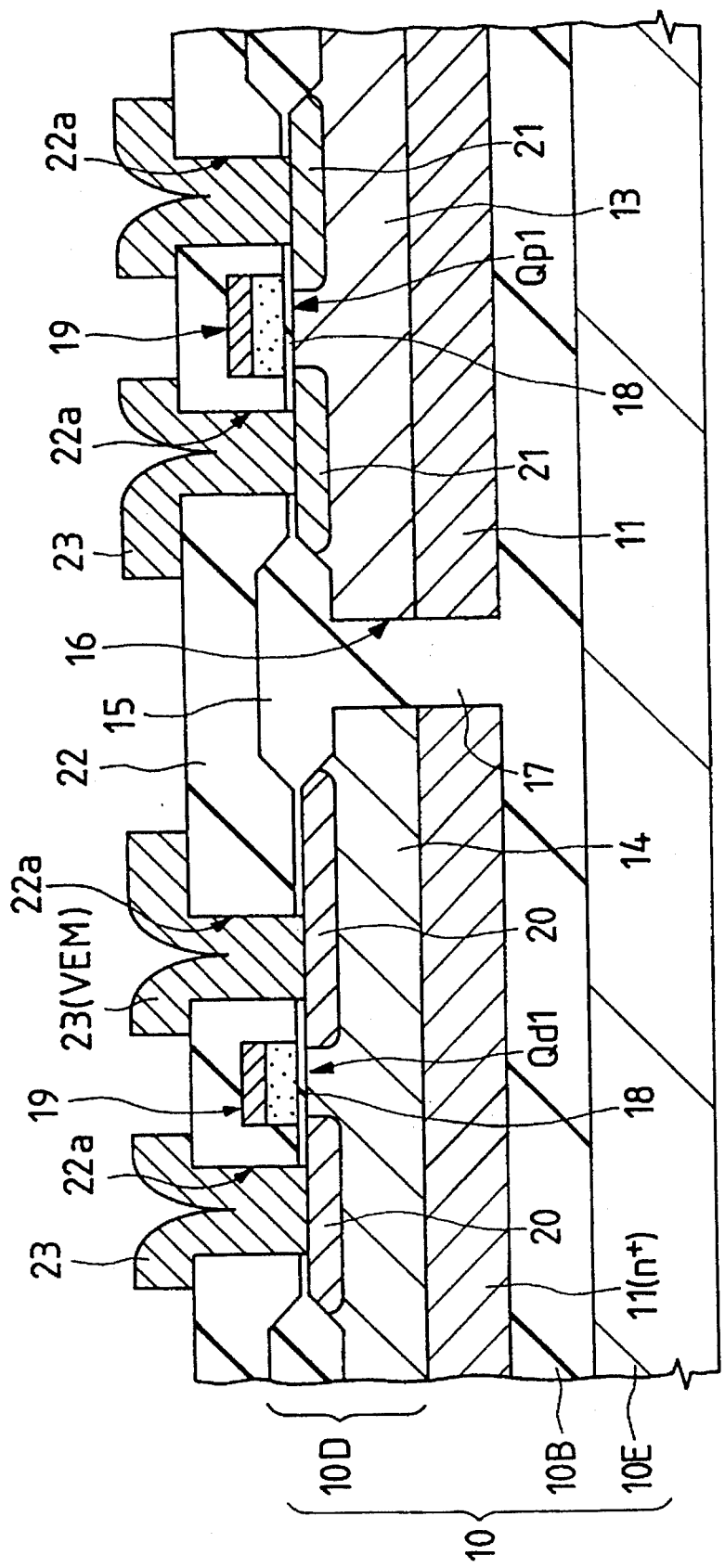
FIG. 21 is a section showing a modification of the present invention.

As shown in FIG. 21 (sectional view), still moreover, the semiconductor substrate 10 may be constructed to have an SOI structure using a $p^-$-type semiconductor substrate 10E as the support substrate, and the $n^+$-type semiconductor region 11 may be formed below the p-type well region 14.

Figure 22:
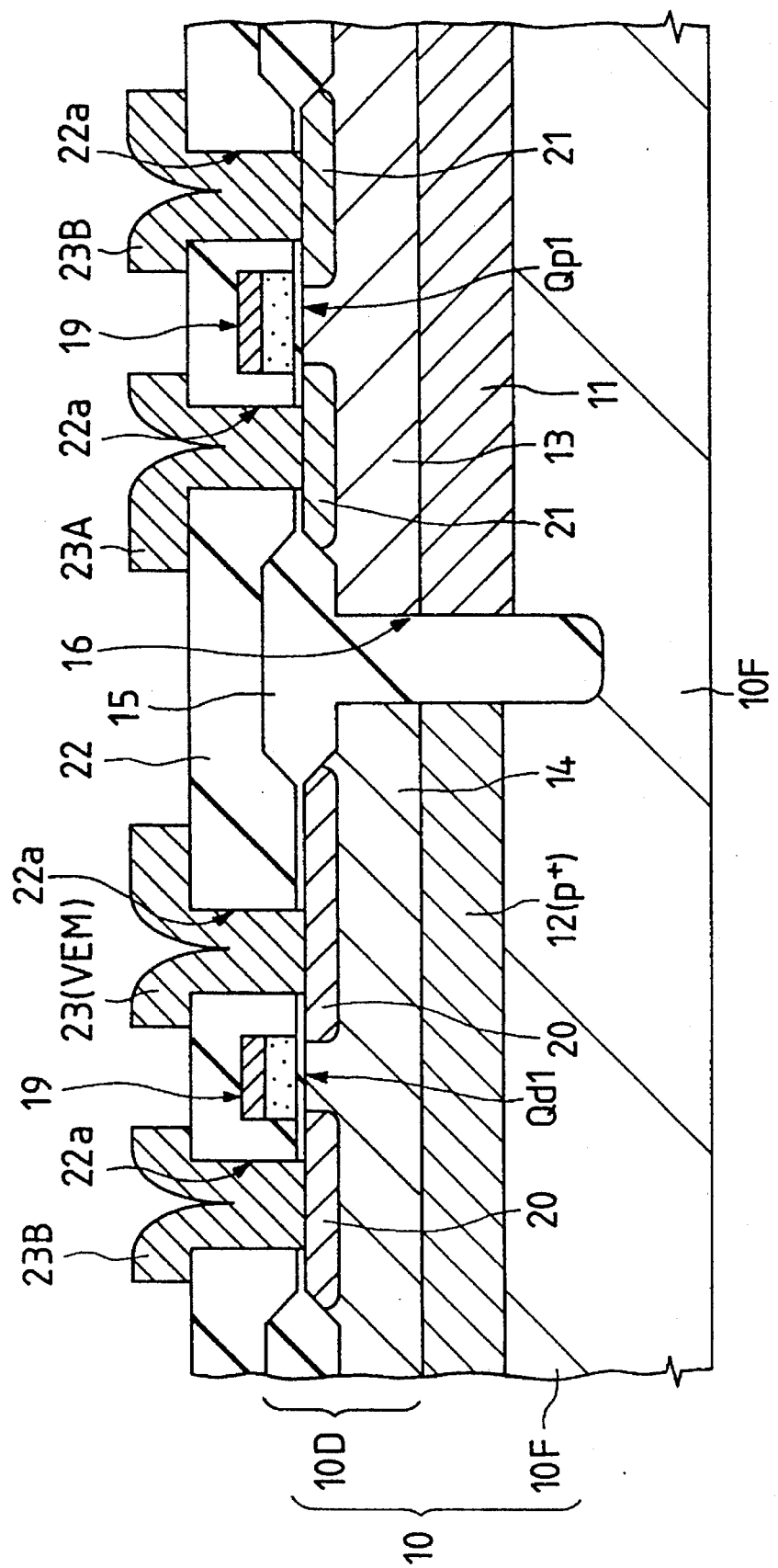
FIG. 22 is a section showing a modification of the present invention.

As shown in FIG. 22 (sectional view), furthermore, the semiconductor substrate 10 may be constructed to have a structure, in which an epitaxial layer 10D is grown on the main surface of a $p^-$-type semiconductor substrate, and below the p-type well region 14 a $p^+$-type semiconductor region 12 which has an impurity concentration higher than that of the p-type well region 14. In this case, since the $p^+$-type semiconductor region 12 can be used as the power supply line, the resistance of the power potential line can be lowered.

Figure 23:
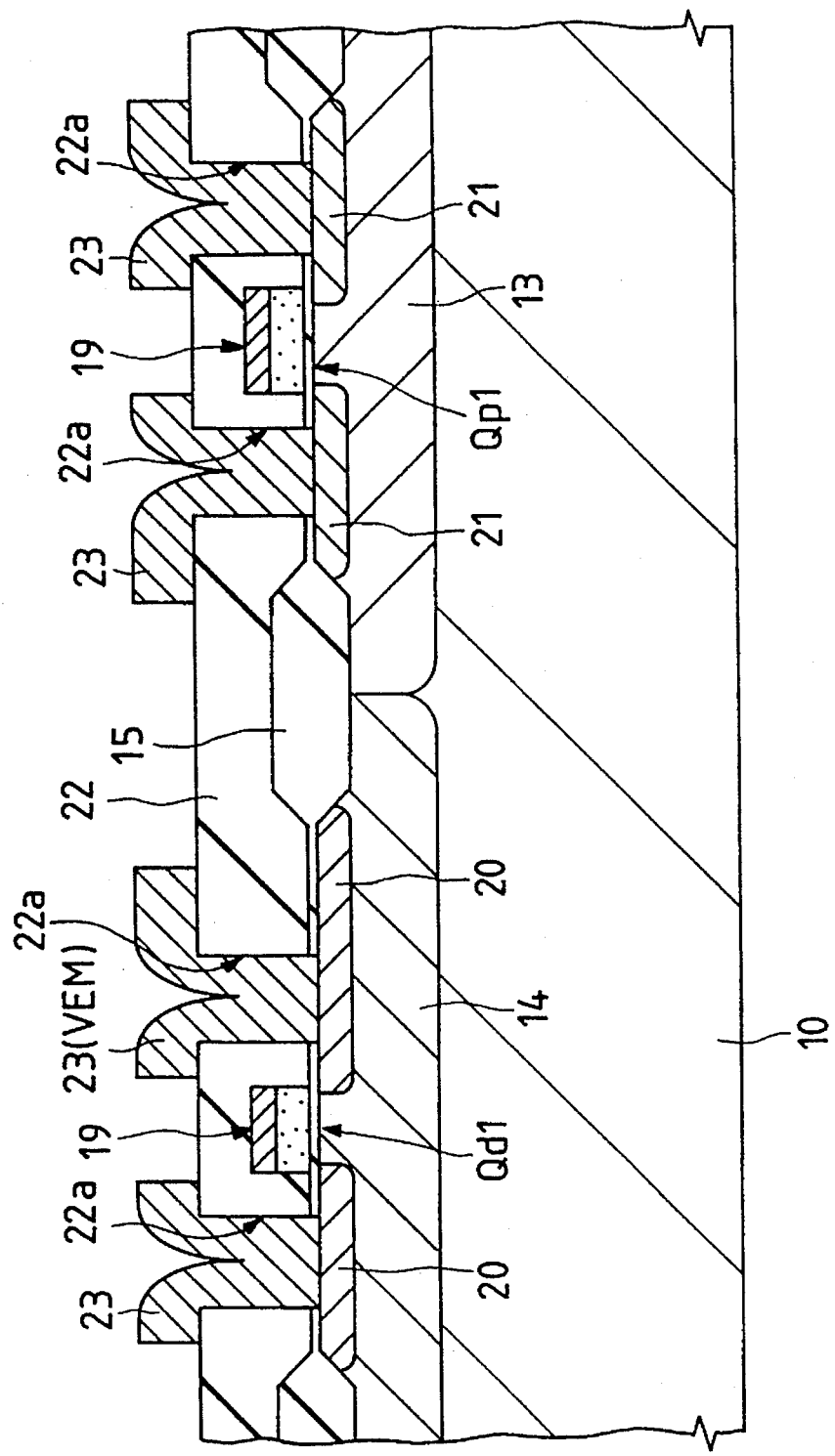
FIG. 23 is a section showing a modification of the present invention.

As shown in FIG. 23 (sectional view), furthermore, the semiconductor substrate 10 may be constructed of a $p^-$-type semiconductor substrate, and on its main surface the n-type well region 13 and the p-type well region 14 may be formed.

Figure 24:
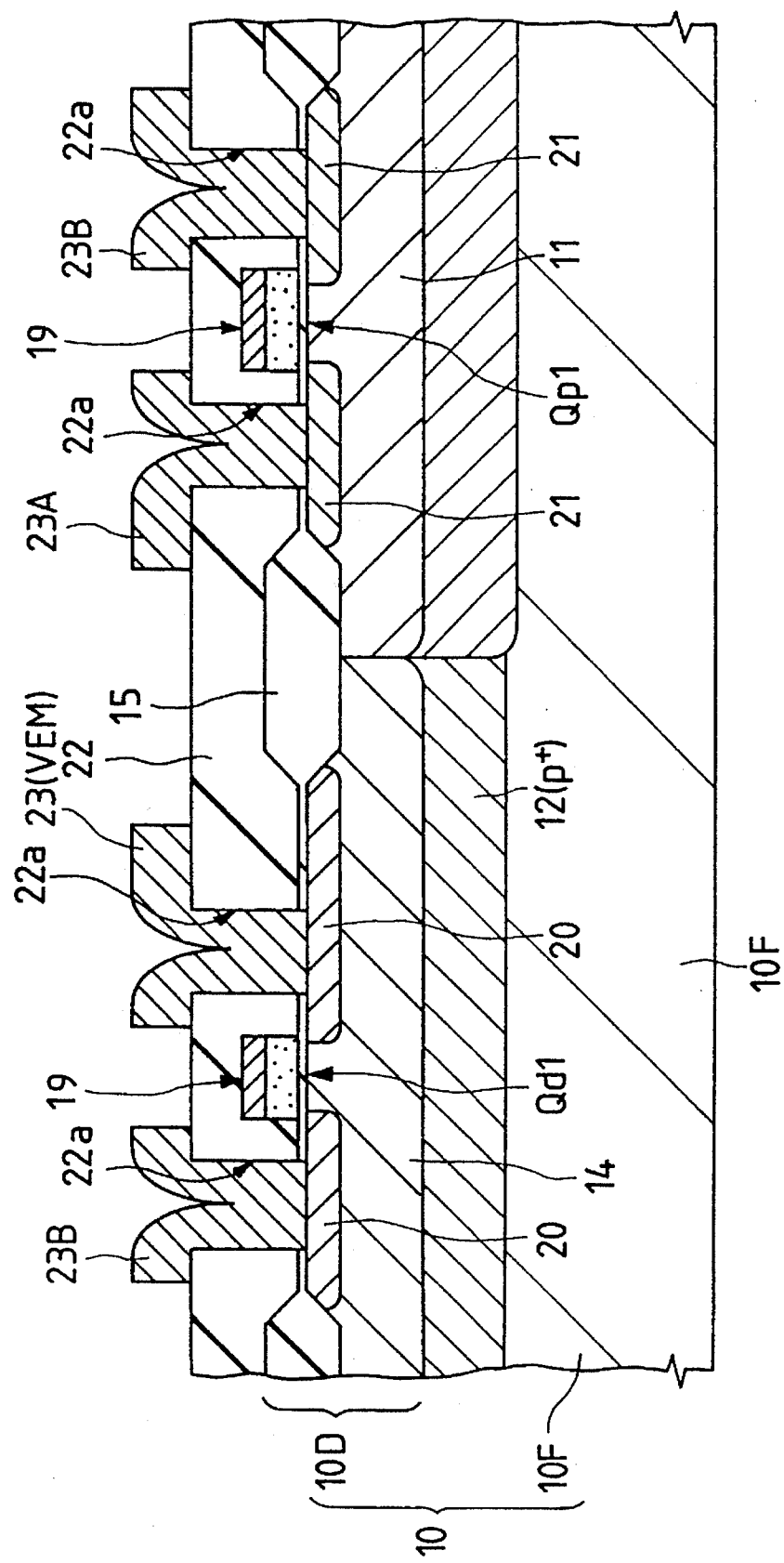
FIG. 24 is a section showing a modification of the present invention.

As shown in FIG. 24 (sectional view), furthermore, the semiconductor substrate 10 may be constructed to have a structure, in which the epitaxial layer 10D is grown on the main surface of the $p^-$-type semiconductor substrate 10F, the n-type well region 13 and the p-type well region 14 are formed on the main surface of the semiconductor substrate 10, the $n^+$-type semiconductor region 11 is formed below the n-type well region 13, and the $p^+$-type semiconductor region 12 is formed below the p-type well region 14.

Thus, the following operational effects can be achieved by the present embodiment.

The n-type well region 13 is used as the power supply line and the reference potential or the power potential can be applied to the individual source regions of the load MISFETs Qp1 and Qp2 of each memory cell 7A. As a result, the power supply line formed of the first level metal wiring layer on the memory cell 7A can be eliminated to reduce the cell size of the memory cells 7A.

Moreover, the p-type well region 14 is used as the power supply line, the reference potential or the operation potential can be applied to the individual source regions of the drive MISFETs Qd1 and Qd2 of each memory cell 7A. As a result, the power supply line formed of the first level metal wiring layer on the memory cell 7A can be eliminated to further reduce the cell size of the memory cells 7A.

By forming the $n^+$-type semiconductor region 11 below the n-type well region 13, still moreover, the resistance of the power supply line can be lowered.

By forming the $p^+$-type semiconductor region 12 below the p-type well region 14, furthermore, the resistance of the power supply line can be lowered.

In the two memory cells 7A adjacent in the row direction, furthermore, the intra-cell wirings 23A are made integral, so that the cell size of the memory cells 7A can be further reduced.

Furthermore, the cell size of the memory cells 7A can be reduced, thereby enhancing the degree of integration of the semiconductor integrated circuit device having the memory cells 7A of the full CMIS structure.

Although our invention has been specifically described on the basis of the foregoing embodiment, it should not be limited to the embodiment but can naturally modified in various manners without departing from the gist thereof.

What is claimed is:

1. A semiconductor memory device comprising:

a) word lines formed on a substrate and extending in a column direction;

b) complementary data line pairs formed on said substrate and extending in a row direction;

c) memory cells formed on said substrate and being arranged in said column and row directions so that each of said memory cells is coupled to a corresponding word line and a corresponding complementary data line pair, each of said memory cells comprising a first inverter circuit and a second inverter circuit, inputs and outputs of said first and second inverter circuits being cross-coupled to each other, each of said first and second inverter circuits comprising a p-channel type MISFET and an n-channel type MISFET, the drain region of said p-channel type MISFET being coupled to the drain region of said n-channel type MISFET, a source region of said p-channel type MISFET being coupled to a first fixed potential line, the source region of said n-channel type MISFET being coupled to a second fixed potential line, said p-channel type MISFET being formed on the main surface of a first n-type semiconductor region in said substrate; and d) conductor layers formed on said substrate, each of said conductor layers electrically connecting said first n-type semiconductor region with the source region of said p-channel type MISFET, wherein said conductor layers are independently formed each other, with respect to said memory cells arranged in said column direction.

2. A semiconductor memory device according to claim 1, further comprising a second n-type semiconductor region formed in said substrate under said first n-type semiconductor region, wherein said second n-type semiconductor region contacts with said first n-type semiconductor region and has an impurity concentration higher than that of said first n-type semiconductor region.

3. A semiconductor memory device according to claim 1, wherein said first fixed potential line includes said first n-type semiconductor region.

4. A semiconductor memory device according to claim 3, wherein each of said conductor layers is formed of a first level metal layer formed on said first n-type semiconductor region.

5. A semiconductor memory device according to claim 4, further comprising third n-type semiconductor regions formed in said first n-type semiconductor region, wherein each of said third n-type semiconductor regions has an impurity concentration higher than that of said first n-type semiconductor region, and wherein said conductor layers contact with said third n-type semiconductor regions.

6. A semiconductor memory device according to claim 4, wherein said second fixed potential line is formed of the same layer as said first level metal layer and extends in said column direction, and wherein said second fixed potential line is connected in common, with respect to said memory cells arranged in said column direction.

7. A semiconductor memory device according to claim 4, further comprising internal wirings for electrically connecting said drain region of p-channel type MISFET with said drain region of said n-channel type MISFET in each of said memory cells, wherein said internal wirings are formed of the same layer as said first level metal layer and extend in said row direction.

8. A semiconductor memory device according to claim 4, wherein said complementary date line pairs are formed of a second level metal layer.

9. A semiconductor memory device according to claim 4, further comprising a power supply line for providing a first fixed potential, formed on said substrate, wherein said power supply line extends in said row direction and is formed of a second level metal layer, and wherein said power supply line is electrically connected with said first n-type semiconductor region and provides said first fixed potential with said first n-type semiconductor region.

10. A semiconductor memory device according to claim 1, wherein said first n-type semiconductor region comprises n-type well regions arranged in said row direction at a predetermined distance, and wherein p-channel type MISFETs in the adjacent two memory cells arranged in said row direction are formed in one of said n-type well regions.

11. A semiconductor memory device according to claim 10, wherein each of said conductor layers contacts with the drain regions of said P-channel type MISFETs in said adjacent two memory cells.

* * * * *